United States Patent
Li et al.

(10) Patent No.: US 12,500,183 B2
(45) Date of Patent: Dec. 16, 2025

(54) SUPPORT DIELECTRIC FIN TO PREVENT GATE FLOP-OVER IN NANOSHEET TRANSISTORS

(71) Applicant: International Business Machines Corporation, Armonk, NY (US)

(72) Inventors: Juntao Li, Cohoes, NY (US); Min Gyu Sung, Latham, NY (US); Ruilong Xie, Niskayuna, NY (US); Julien Frougier, Albany, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 488 days.

(21) Appl. No.: 18/059,093

(22) Filed: Nov. 28, 2022

(65) Prior Publication Data
US 2024/0178156 A1    May 30, 2024

(51) Int. Cl.
| | |
|---|---|
| *H01L 23/00* | (2006.01) |
| *H01L 21/306* | (2006.01) |
| *H10D 30/67* | (2025.01) |
| *H10D 62/10* | (2025.01) |

(52) U.S. Cl.
CPC ...... *H01L 23/562* (2013.01); *H01L 21/30604* (2013.01); *H10D 30/6735* (2025.01); *H10D 62/121* (2025.01)

(58) Field of Classification Search
CPC .. H10D 30/024; H10D 30/6735; H10D 30/62; H01L 23/562; H01L 21/30604
See application file for complete search history.

(56) References Cited

U.S. PATENT DOCUMENTS

| | | |
|---|---|---|
| 7,795,669 B2 | 9/2010 | Georgakos et al. |
| 10,096,683 B2 | 10/2018 | Then et al. |
| 10,629,698 B2 | 4/2020 | Cheng et al. |
| 10,707,083 B2 | 7/2020 | Cheng et al. |
| 10,950,606 B2 | 3/2021 | Hafez et al. |
| 11,145,551 B2 | 10/2021 | Basker et al. |
| 11,264,287 B2 | 3/2022 | Chen et al. |
| 11,417,685 B2 | 8/2022 | Huang et al. |
| 2014/0367795 A1* | 12/2014 | Cai ............ H10D 84/834 438/275 |
| 2017/0358498 A1 | 12/2017 | Cheng et al. |
| 2020/0403084 A1* | 12/2020 | Hsu ............ H10D 84/834 |
| 2021/0091179 A1* | 3/2021 | Wang ............ H10D 62/021 |
| 2021/0098466 A1* | 4/2021 | Liaw ............ H10B 10/12 |

* cited by examiner

*Primary Examiner* — Changhyun Yi
(74) *Attorney, Agent, or Firm* — Amin, Turocy & Watson, LLP

(57) ABSTRACT

One or more systems, devices, and/or methods of fabrication provided herein relate to nanosheet transistors with support dielectric pillars. According to one embodiment, a transistor device can comprise an active transistor fin and a support dielectric pillar located adjacent to the active transistor fin, wherein the support dielectric pillar stabilizes the active transistor fin.

20 Claims, 22 Drawing Sheets

FIG. 2A  FIG. 2B

SUPPORT DIELECTRIC FIN TO PREVENT GATE FLOP-OVER IN NANOSHEET TRANSISTORS

BACKGROUND

The subject disclosure relates to nanosheet transistors, and more specifically, to nanosheet transistors with support dielectric fins.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a transistor can comprise an active transistor fin, and a support dielectric pillar located adjacent to the active transistor fin, wherein the support dielectric pillar stabilizes the active transistor fin.

According to another embodiment, a method for fabricating a transistor by a fabrication system can comprise cutting, by the fabrication system, a first fin and a second fin on a substrate, forming, by the fabrication system, an active transistor fin from the first fin and the second fin, and forming, by the fabrication system, a support dielectric pillar adjacent to the active transistor fin.

According to another embodiment, a method for fabricating a transistor by a fabrication system can comprise forming, by the fabrication system, two or more fins on a substrate, forming, by the fabrication system, spacers on sidewalls of the two or more fins, depositing, by the fabrication system, a nanosheet film around the two or more fins, depositing, by the fabrication system, a nanosheet film around the two or more fins, depositing, by the fabrication system, a nanosheet film around the two or more fins, forming, by the fabrication system, a support dielectric pillar from the two or more channels and forming, by the fabrication system, an active transistor fin from the first portion of the two or more fins.

DESCRIPTION OF THE DRAWINGS

FIGS. 2A, 2B and 2C illustrate cross-sections of a transistor comprising a support dielectric pillar, in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Nanosheet fabrication is being pursed as a viable architecture for scaling complementary metal-oxide semiconductors (CMOS) beyond 5 nm nodes. As the minimum dimension of gates of transistors continues to shrink in accordance with technological advancements, polysilicon gate structures are called for to ensure device performance. However, polysilicon gate structures are prone to structural issues, such as gate flop-over over shallow trench isolation (STI) regions. This becomes a greater issue as gate structures become taller and/or thinner, leading to greater stability issues. Gate-flop over can lead to issues further along in production such as during dummy gate removal, source/drain epitaxy and metallic gate formation among others.

Additionally, challenges exist for precise control of gate profiles as well as gate mechanical stability. For example, in order to improve driving current, four or more nanosheet channels are called for in nanosheet CMOS devices, which calls for taller gate structures leading to greater mechanical instability. Furthermore, structures that utilize NFET and PFET stacking call for taller gate structures, again leading to greater mechanical instability. In view of the aforementioned problems with current nanosheet transistor fabrication, the described subject matter illustrates transistor devices and method of fabrication of transistor devices with greater gate structure mechanical stability. For example, as described in greater detail below, a transistor device can comprise, an active transistor fin, and a support dielectric pillar located adjacent to the active transistor fin, wherein the support dielectric pillar stabilizes the active transistor fin. As the support dielectric fin stabilizes the active transistor fin, the active fin is less susceptible to stability issues, thereby preventing mechanical issues such as flop-over and enabling taller active transistor fins and gate structures.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
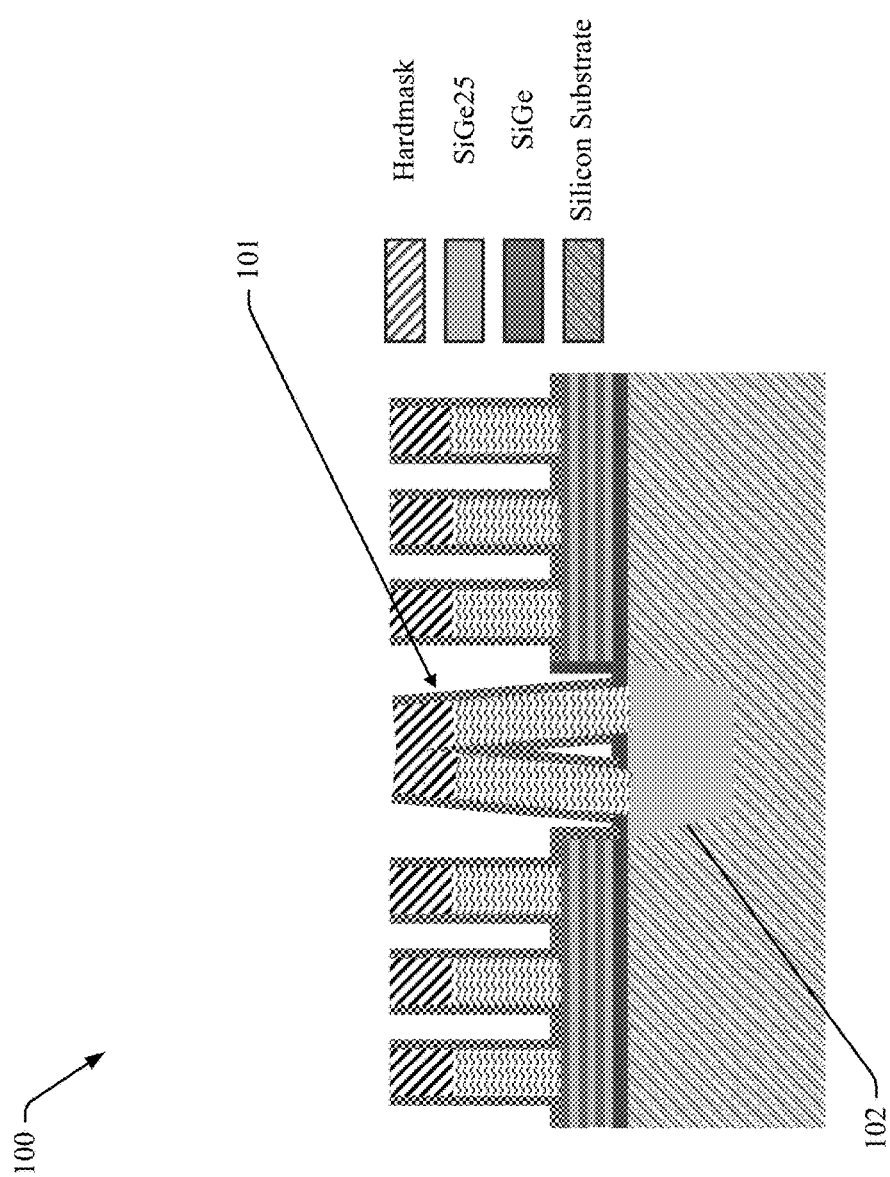
FIG. 1 illustrates an example cross-section of a transistor with flop-over, in accordance with one or more embodiments described herein.

FIG. 1 illustrates an example cross-section of a transistor 100 with flop-over, in accordance with one or more embodiments described herein. Transistor 100 comprises multiple gate structures and an STI region 102. As shown by point 101, two gate structures are bent together (e.g., suffering from flop-over) due to the high aspect ratio of the gate structure (e.g., tall thin gates) leading to poor mechanical stability.

Figure 2C:
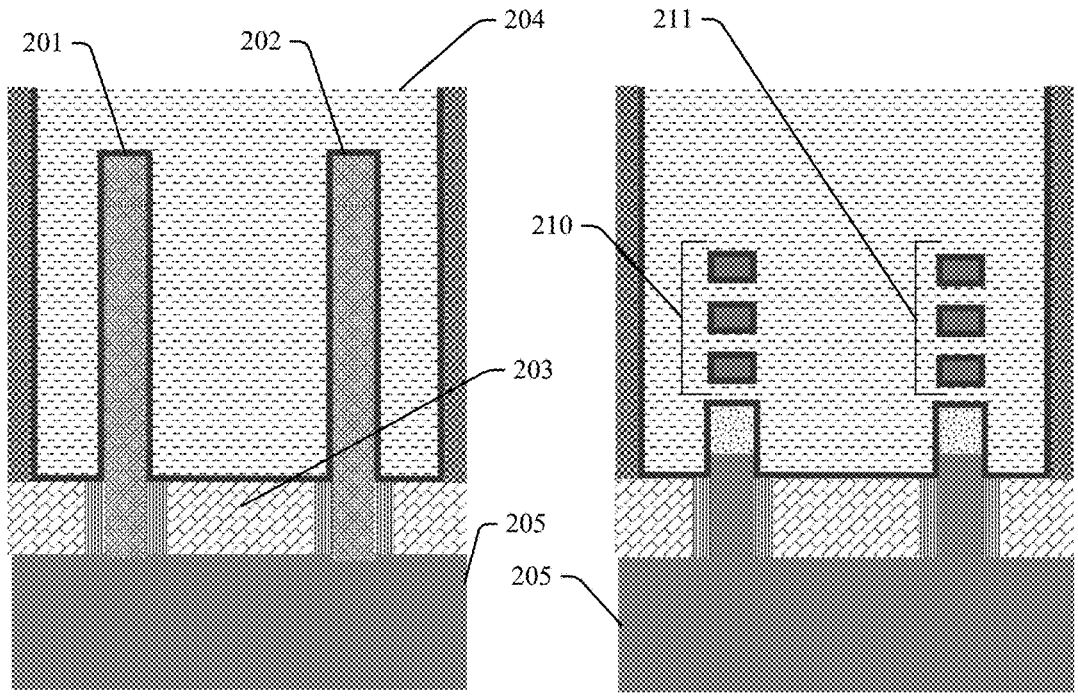
Figure 2C:
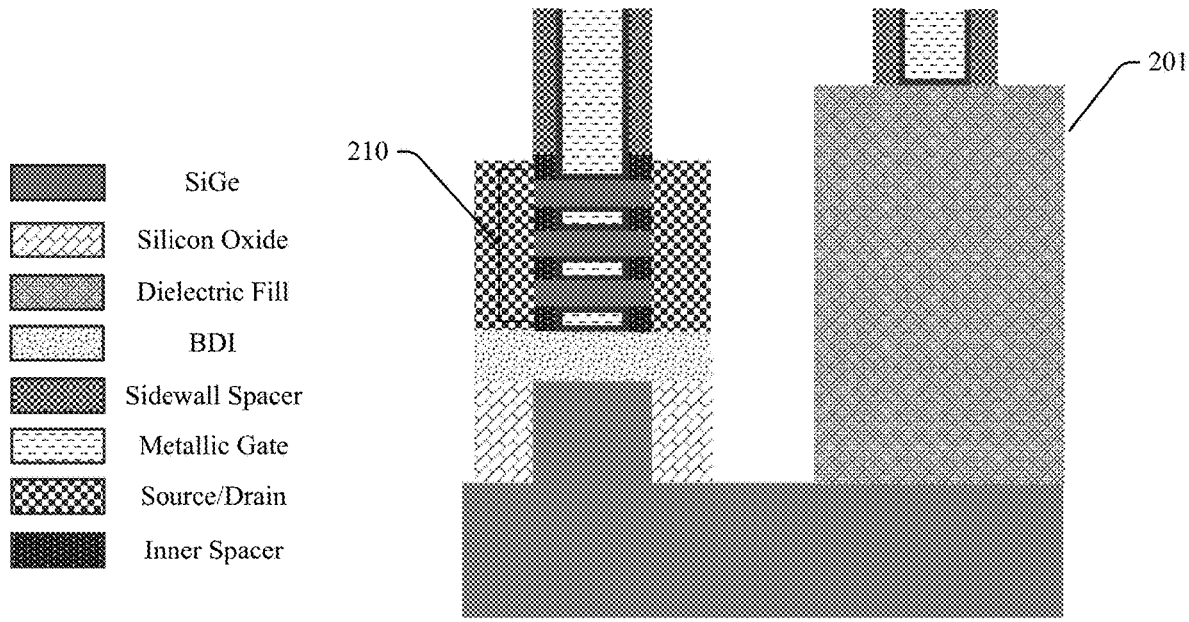

FIGS. 2A, 2B and 2C illustrate cross-sections of a transistor comprising a support dielectric pillar, in accordance with one or more embodiments described herein. As shown, FIG. 2A comprises a first support pillar 201 and a second support pillar 202, an STI region 203 and a metallic gate 204 located on a substrate 205. As shown, FIG. 2B comprises a first active transistor fin 210, and a second active pillar 211 located on the substrate 205. FIG. 2C illustrates a cross-section of a gate region of a transistor device. As shown, FIG. 2C comprises an alternate view of the first active transistor fin 210 and the first support pillar 201. As described below in greater detail, during fabrication, a dummy gate can wrap around the first support pillar 201 and the second support pillar 202 to provide greater mechanical stability. Additionally, as shown, the first support pillar 201 can be taller than the first active transistor fin 210 in order to protect the first active transistor fin during fabrication.

Figure 3:
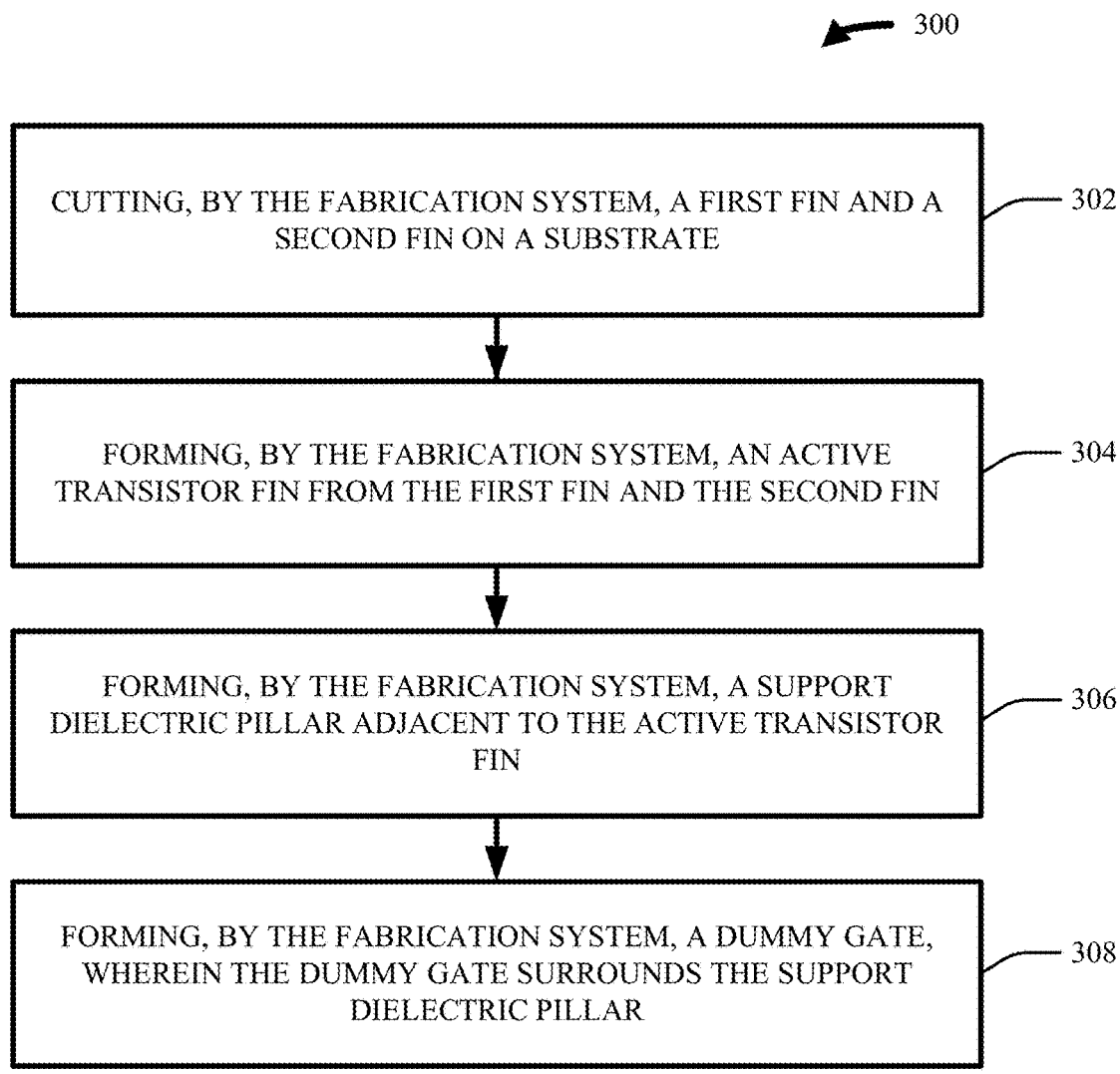
FIG. 3 illustrates an example, non-limiting flow diagram of a method of fabrication of a transistor with a support dielectric pillar in accordance with one or more embodiments described herein.

FIG. 3 illustrates an example, non-limiting flow diagram of a method of fabrication 300 of a transistor with a support dielectric pillar in accordance with one or more embodiments described herein.

At 302, method 300 can comprise cutting, by a fabrication system, a first fin and a second fin on a substrate. For example, a substrate can comprise alternative layers of Si and SiGe. A cutting process can cut the alternating layers of Si and SiGe to form a first fin and a second fin.

At 304, method 300 can comprise forming, by the fabrication system, a one or more active transistor fins from the first fin and/or the second fin. For example, the layers of SiGe can be removed and replaced with a metal to form one or more active transistor fins.

At 306, method 300 can comprise forming, by the fabrication system, one or more support dielectric pillars adjacent to the one or more active transistor fins. For example, in a portion of the first fin and the second fin, the alternative layers of Si and SiGe can be removed and replaced by a dielectric fill material to form one or more dielectric support pillars. In an embodiment, the dielectric fill material can comprise at least one of SiCN, SiON, SiCO and/or SiBCN.

At 308, method 300 can comprise forming, by the fabrication system, a dummy gate, wherein the dummy gate surrounds the one or more support dielectric pillars. As the dummy gate surrounds the one or more support pillars, the support pillars provide mechanical stability during further stages of production.

Figure 4A:
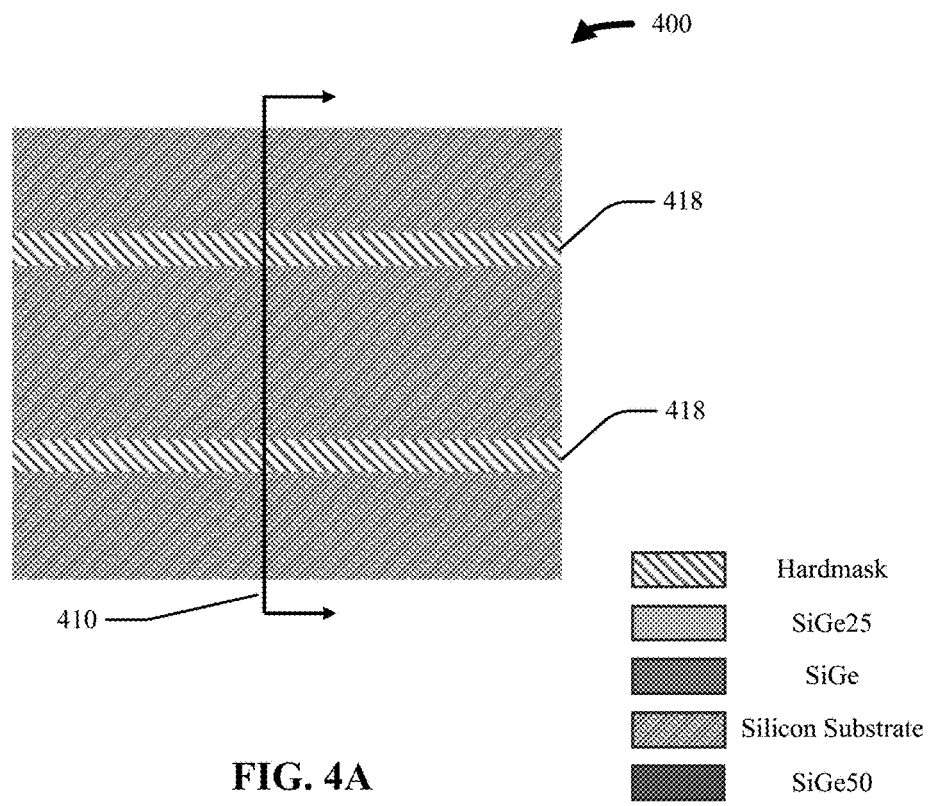
FIG. 4A illustrates a top-down view of an example, non-limiting, starting substrate for production of a transistor device comprising one or more dielectric support pillars in accordance with one or more embodiments described herein.

FIG. 4A illustrates a top-down view of an example, non-limiting, starting substrate 400 for production of a transistor device comprising one or more dielectric support pillars in accordance with one or more embodiments described herein. As shown, substrate 400 comprises a silicon material and two hardmasks 418. FIG. 4A further comprises line 410 for illustration of cross-sections.

Figure 4B:
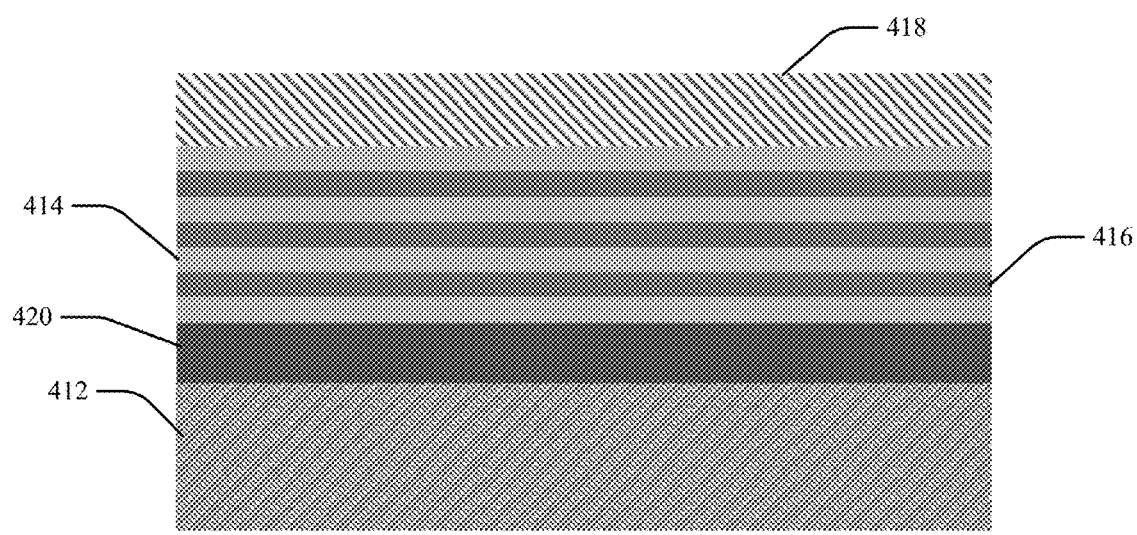
FIG. 4B illustrates a cross-section of a starting substrate for production of a transistor device comprising one or more dielectric support pillars in accordance with one or more embodiments described herein.

FIG. 4B illustrates a cross-section of a starting substrate 400 along line 410 of FIG. 4A. As shown, FIG. 4B comprises a base silicon layer 412, a first layer comprising SiGe50 420 (e.g., SiGe comprising 50% Ge), one or more layers comprising SiGe25 414 (e.g., SiGe comprising 25% Ge), one or more layers comprising Si 416 and a hardmask 418. In an embodiment, hardmask 418 can comprise silicon nitride or a combination of multiple materials. It should be appreciated that in one or more embodiments, alternative materials can be utilized based on the transistor design.

Figure 5:
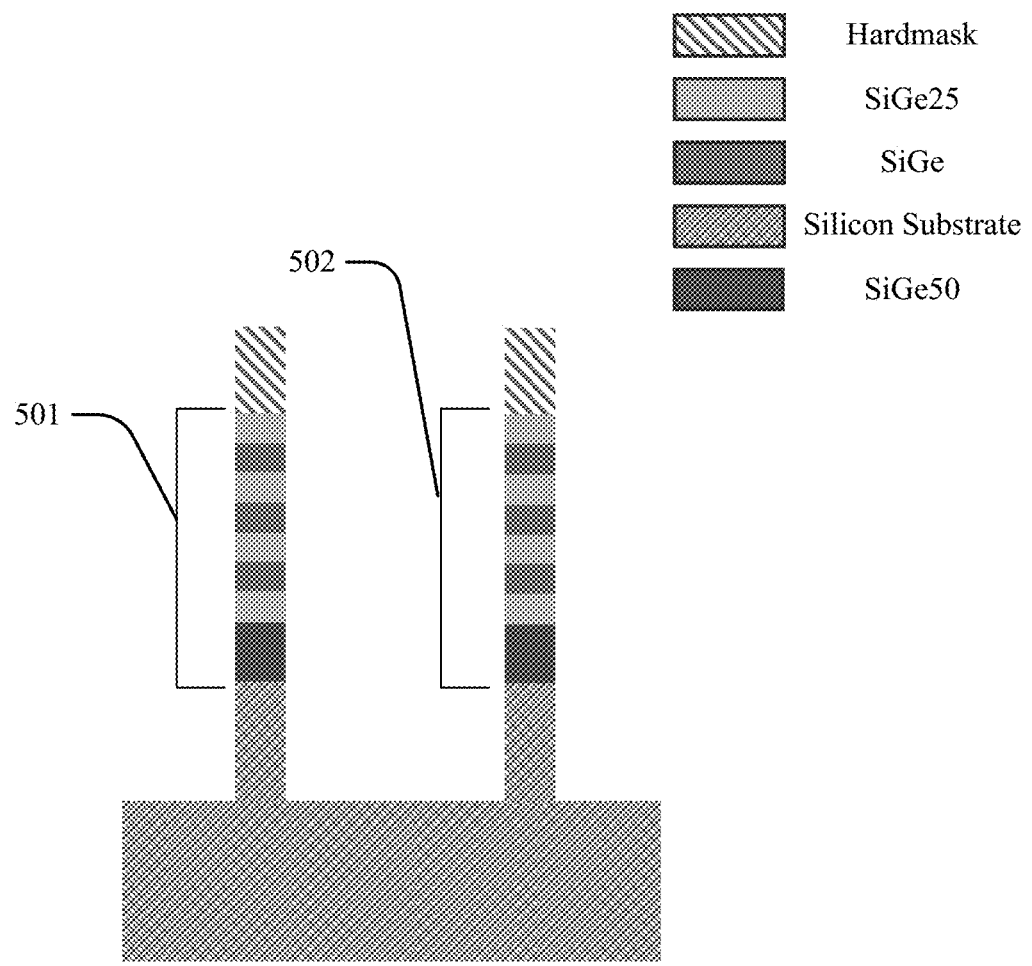
FIG. 5 illustrates a cross-section of a first stage of production of a transistor in accordance with one or more embodiments described herein

FIG. 5 illustrates a cross-section of a first stage of production of a transistor in accordance with one or more embodiments described herein. FIG. 5 comprises a cross-section of substrate 400 along line 410 of FIG. 4A. During a first stage of production fin cuts can be made to the starting substrate 400 to form a first fin 501 and a second fin 502. As shown, the first fin 501 and the second fin 502 can comprise alternating layers of Si and SiGe.

Figure 6A:
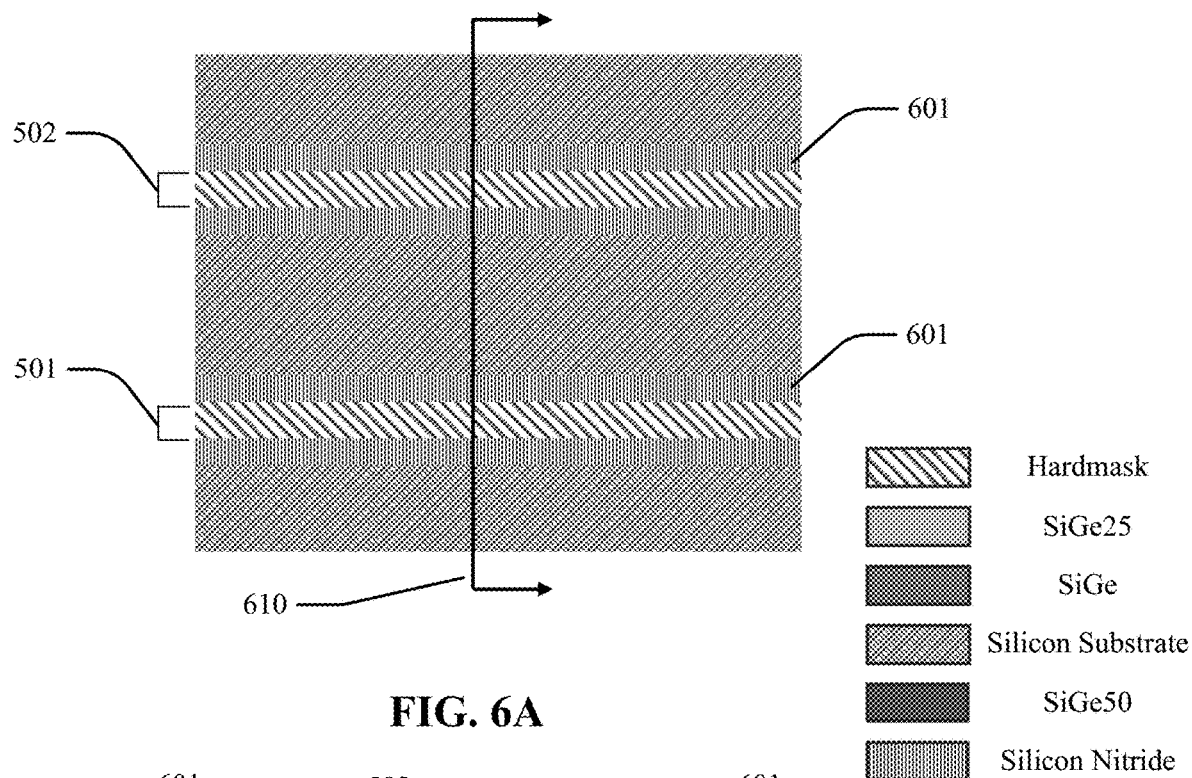
FIG. 6A illustrates a top-down view of a second stage of production of a transistor device in accordance with one or more embodiments described herein.

FIG. 6A illustrates a top-down view of a second stage of production of a transistor device in accordance with one or more embodiments described herein. During a second stage of production, a nitride spacer 601 can be formed along the side was of the first fin 501 and the second fin 502. In an embodiment, the nitride spacer 601 can comprise silicon nitride, or another suitable material utilized in transistor spacers. In an embodiment, the nitride spacer 601 can comprise a width between 4 nm and 7 nm. FIG. 6A also comprises line 610 for illustration of cross-sections.

Figure 6B:
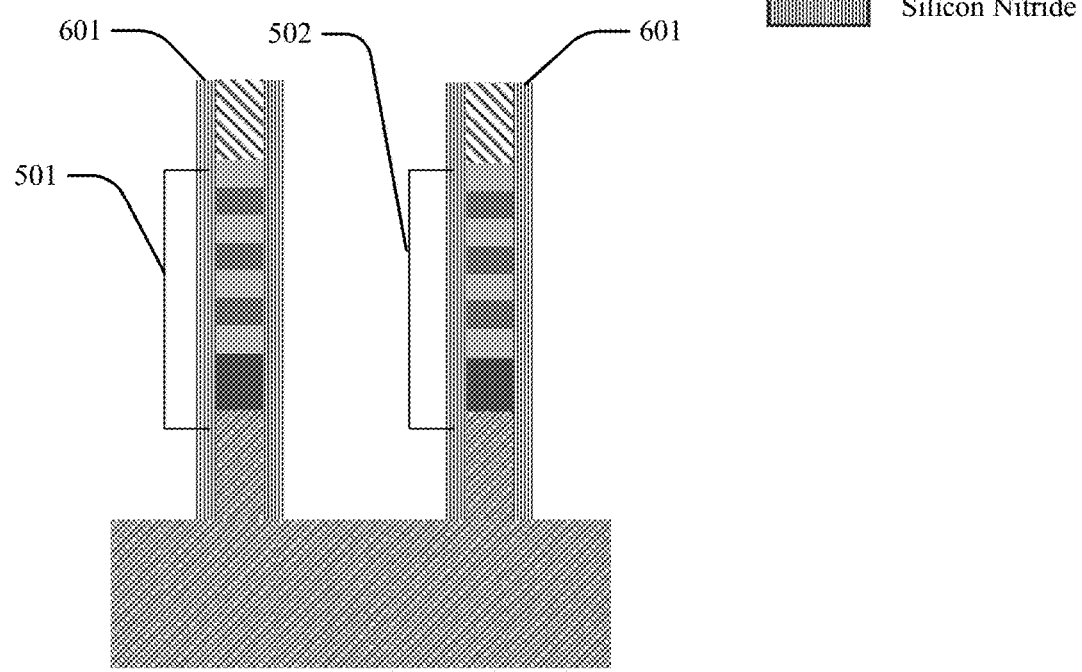
FIG. 6B illustrates a cross-section of a second stage of production of a transistor in accordance with one or more embodiments described herein.

FIG. 6B illustrates a cross-section of a second stage of production of a transistor in accordance with one or more embodiments described herein. FIG. 6B illustrates a cross-section along line 610 of FIG. 6A. As shown, FIG. 6B comprises nitride spacers 601 deposited along the sidewalls of the first fin 501 and the second fin 502.

Figure 7A:
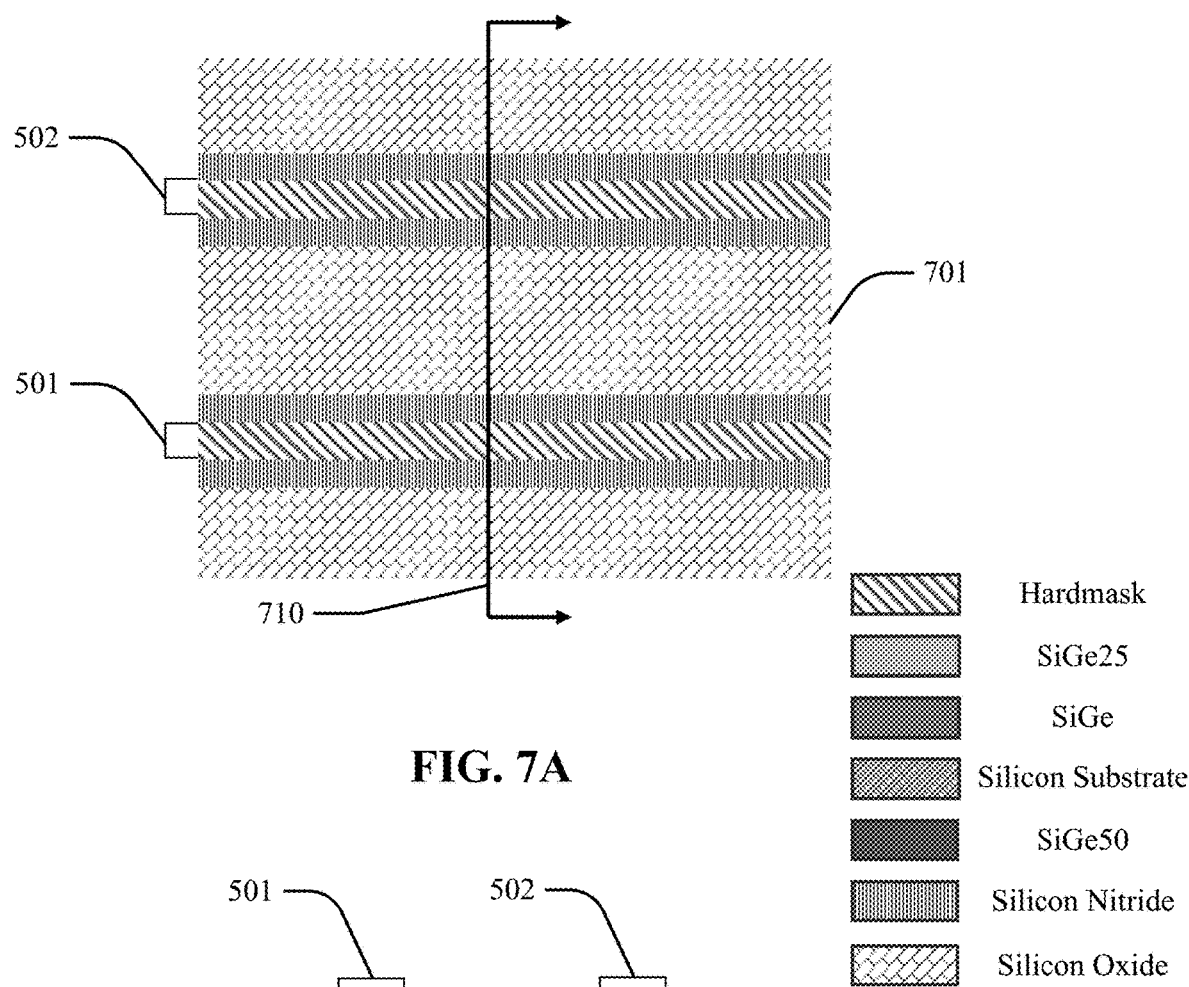
FIG. 7A illustrates a top-down view of a third stage of production of a transistor device in accordance with one or more embodiments described herein.

FIG. 7A illustrates a top-down view of a third stage of production of a transistor device in accordance with one or more embodiments described herein. As shown by FIG. 7A, a silicon oxide material 701 can be deposited on the sides of the first fin 501 and the second fin 502. FIG. 7A also comprises line 710 for illustration of cross-sections.

Figure 7B:
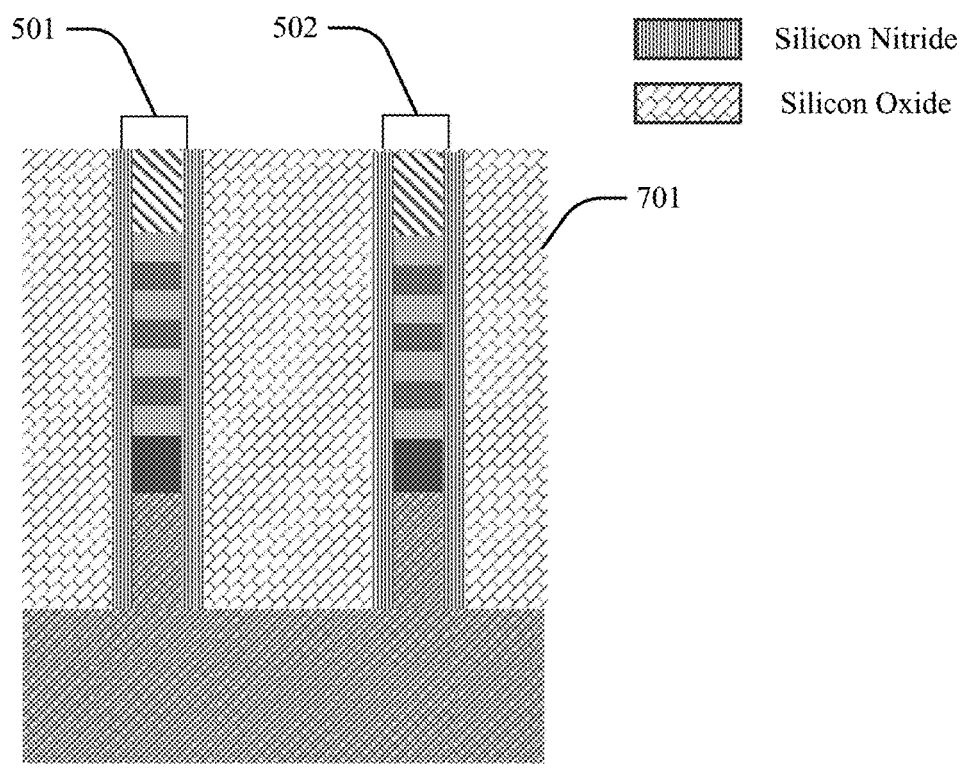
FIG. 7B illustrates a cross-section of a third stage of production of a transistor device in accordance with one or more embodiments described herein.

FIG. 7B illustrates a cross-section of a third stage of production of a transistor device in accordance with one or more embodiments described herein. FIG. 7B illustrates a cross-section along line 710 of FIG. 7A. As shown, FIG. 7B comprises the silicon oxide material 701 deposited on the sides of the first fin 501 and the second fin 502.

Figure 8A:
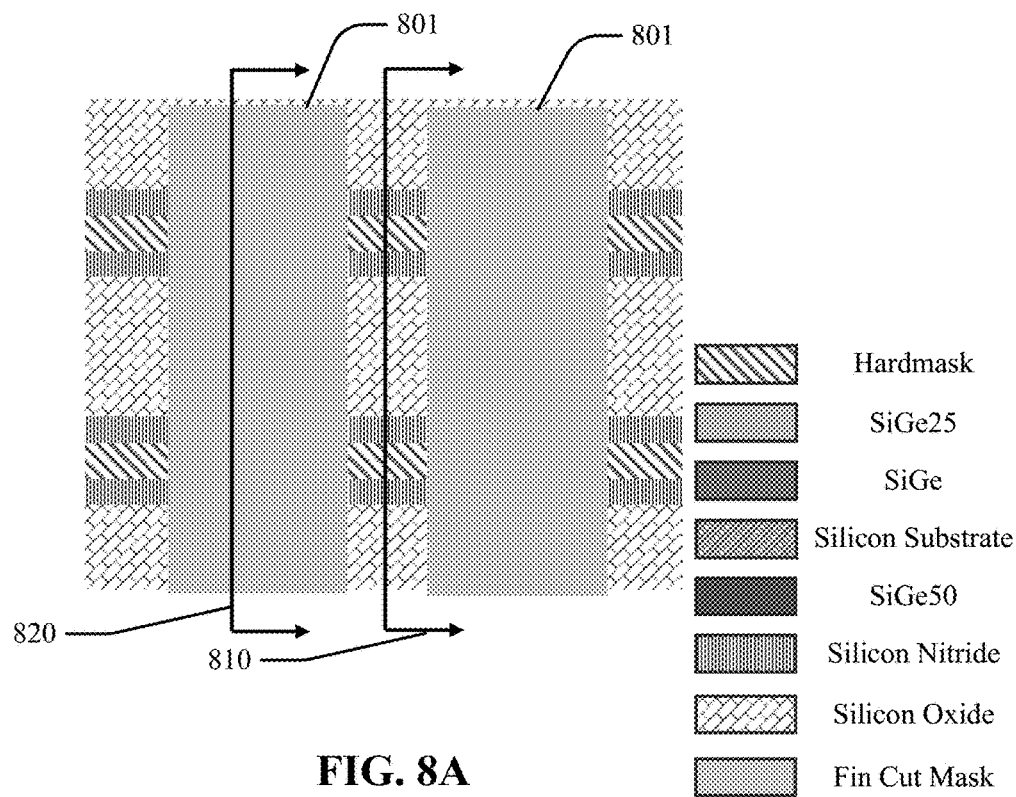
FIG. 8A illustrates a top-down view of a fourth stage of production of a transistor device in accordance with one or more embodiments described herein.

FIG. 8A illustrates a top-down view of a fourth stage of production of a transistor device in accordance with one or more embodiments described herein. As shown by FIG. 8A, one or more fin cut masks 801 can be patterned to identify where active transistor fins will be formed. FIG. 8A also comprises line 810 and line 820 for illustration of cross-sections.

Figure 8B:
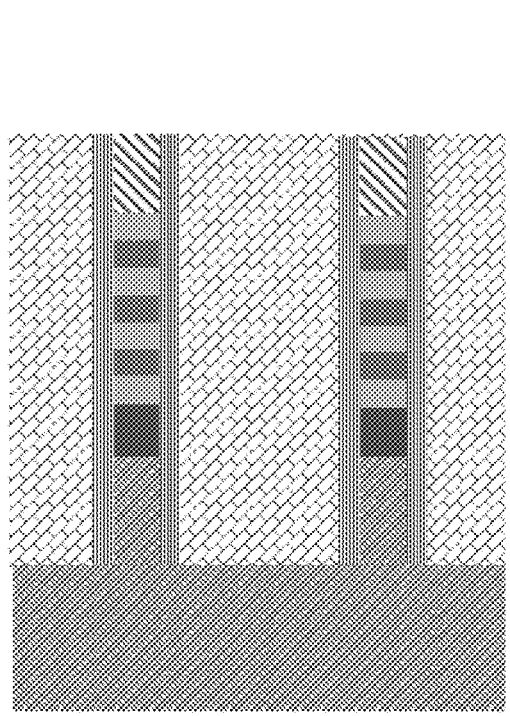
FIGS. 8B and 8C illustrate cross-sections of a fourth stage of production of a transistor device in accordance with one or more embodiments described herein.
Figure 8C:
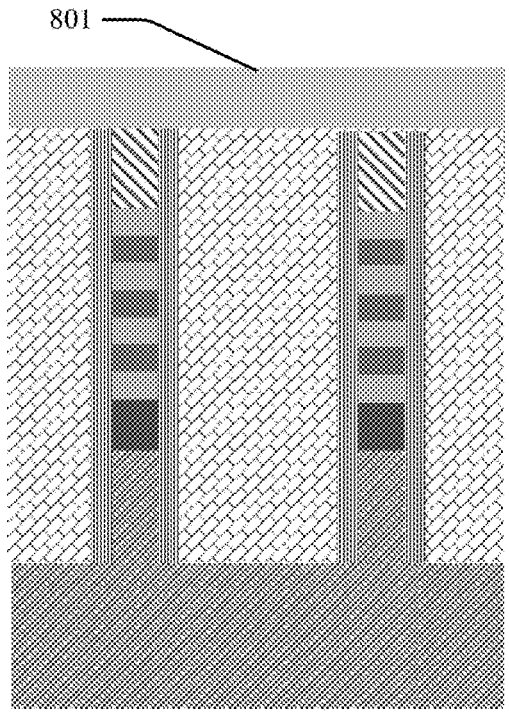

FIGS. 8B and 8C illustrate cross-sections of a fourth stage of production of a transistor device in accordance with one or more embodiments described herein. FIG. 8B illustrates a cross-section along line 810. As shown, FIG. 8B is not covered by fin cut mask 801 and can be cut and/or etched during later stages of production. FIG. 8C illustrates a cross-section along line 820. As shown, FIG. 8C is covered by fin cut mask 801, and will be protected from cuts and/or etching in later stages of production.

Figure 9A:
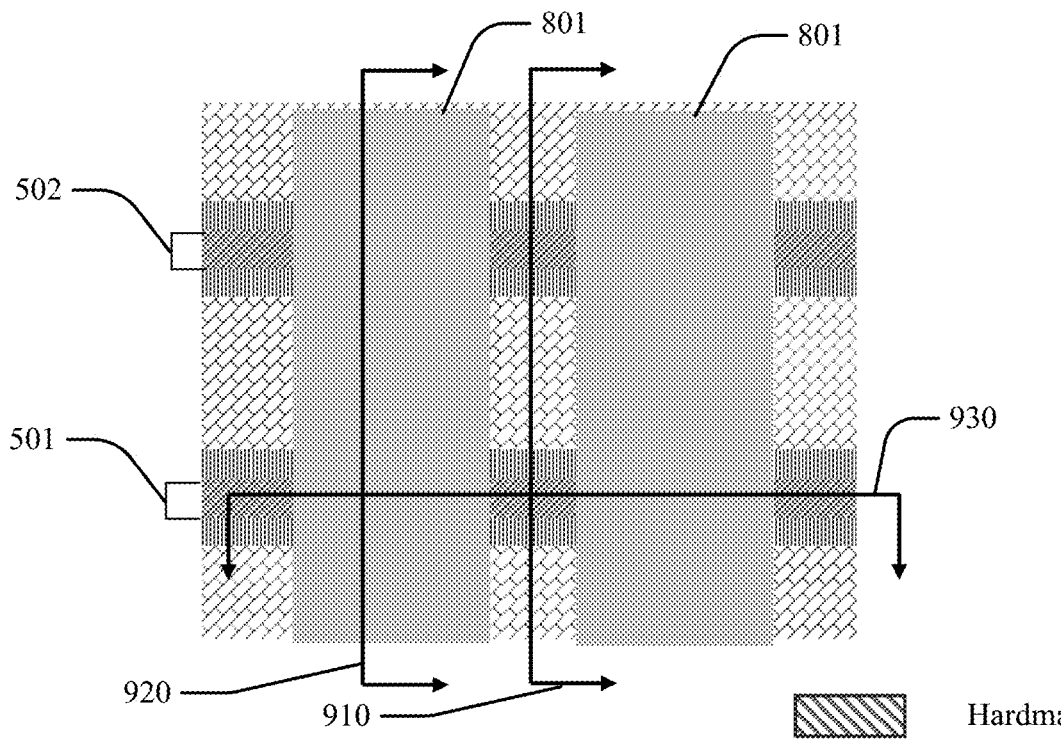
FIG. 9A illustrates a top-down view of a fifth stage of production of a transistor device in accordance with one or more embodiments described herein.

FIG. 9A illustrates a top-down view of a fifth stage of production of a transistor device in accordance with one or more embodiments described herein. As shown by FIG. 9A, the first fin 501 and the second fin 502 can be etched to remove the layers stacked on the base silicon layer 412. FIG. 9A also comprises line 910, line 920 and line 930 for illustration of cross-sections.

Figure 9B:
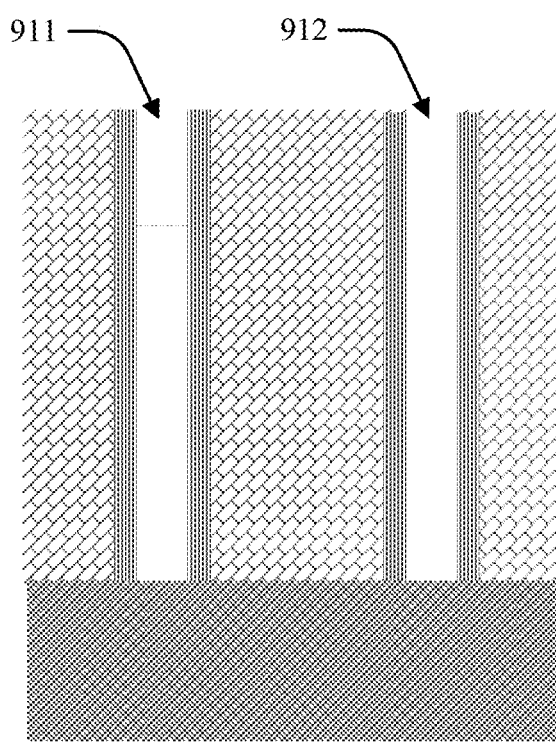
FIGS. 9B, 9C and 9D illustrate cross-sections of a fifth stage of production of a transistor device in accordance with one or more embodiments described herein.
Figure 9C:
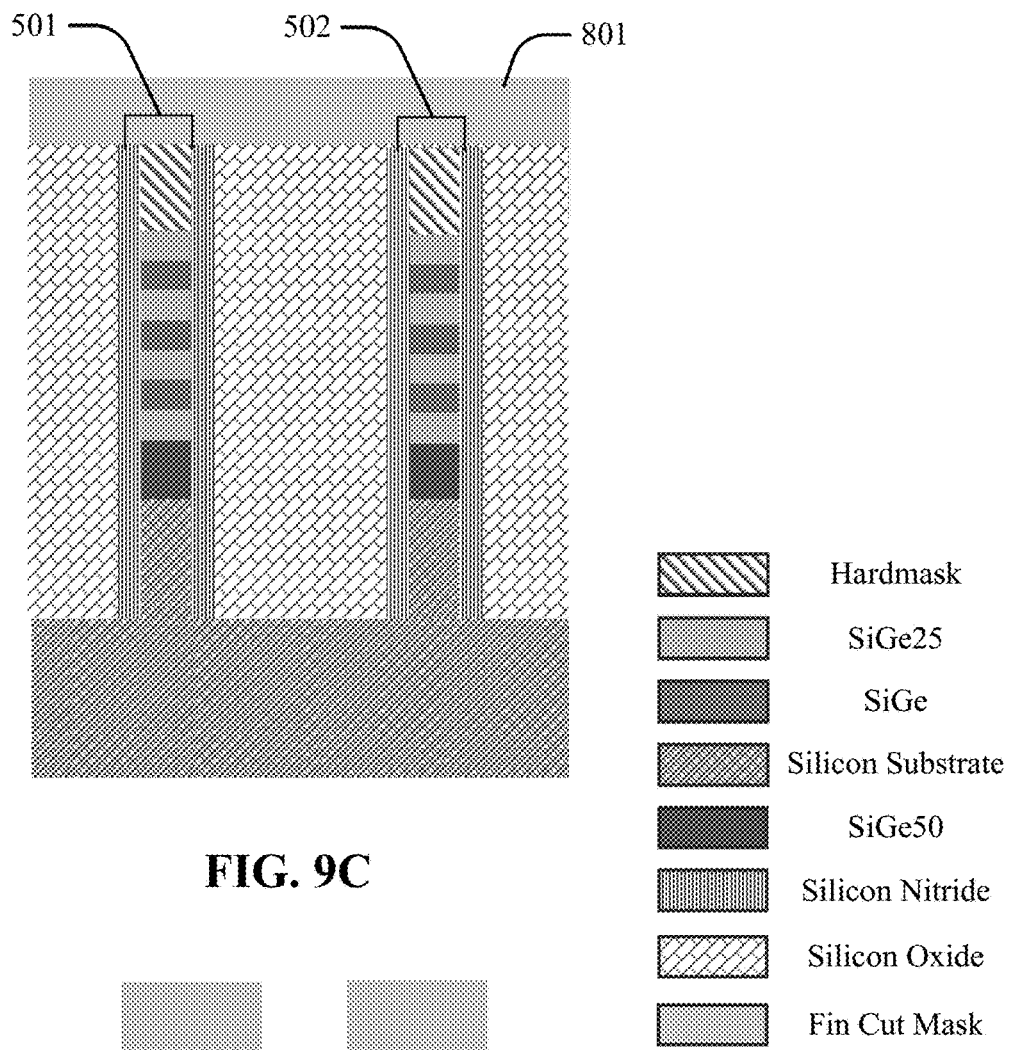
Figure 9D:
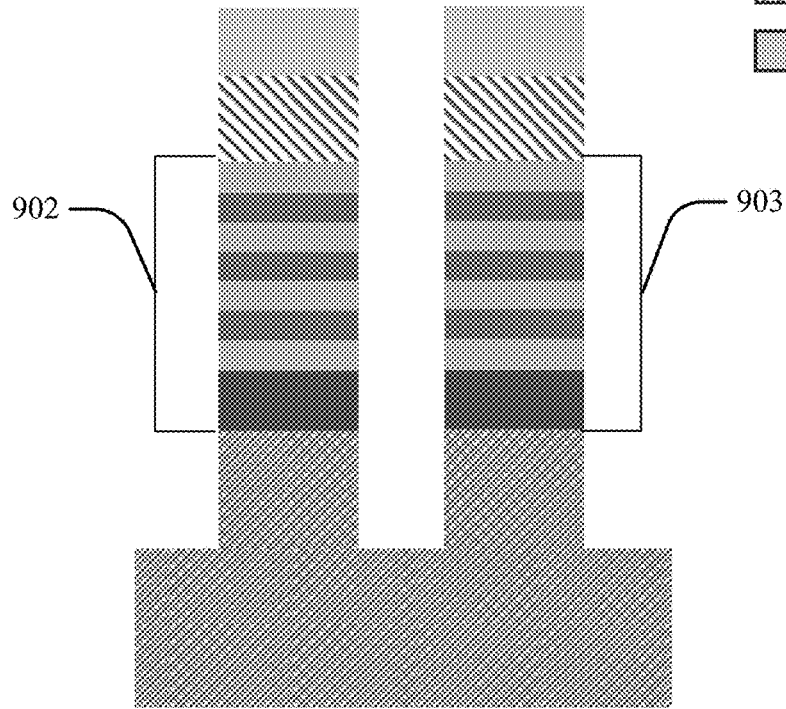

FIGS. 9B, 9C and 9D illustrate cross-sections of a fifth stage of production of a transistor device in accordance with one or more embodiments described herein. FIG. 9B illustrates a cross-section along line 910. As shown, FIG. 9B is not covered by fin cut mask 801, and accordingly, the first fin 501 and the second fin 502 are etched to produce the first channel 911 and the second channel 912. FIG. 9C illustrates a cross-section along line 920. As shown, FIG. 9C is covered by fin cut mask 801, and the first fin 501 and the second fin 502 are not etched. FIG. 9D illustrates a cross-section along line 930. As shown, the portions of the first fin 501 not covered by fin cut mask 801 are etched away. Similarly, the portions of the first fin 501 covered by fin cut mask 801 are protected forming first active pillar 902 and second active pillar 903.

Figure 10A:
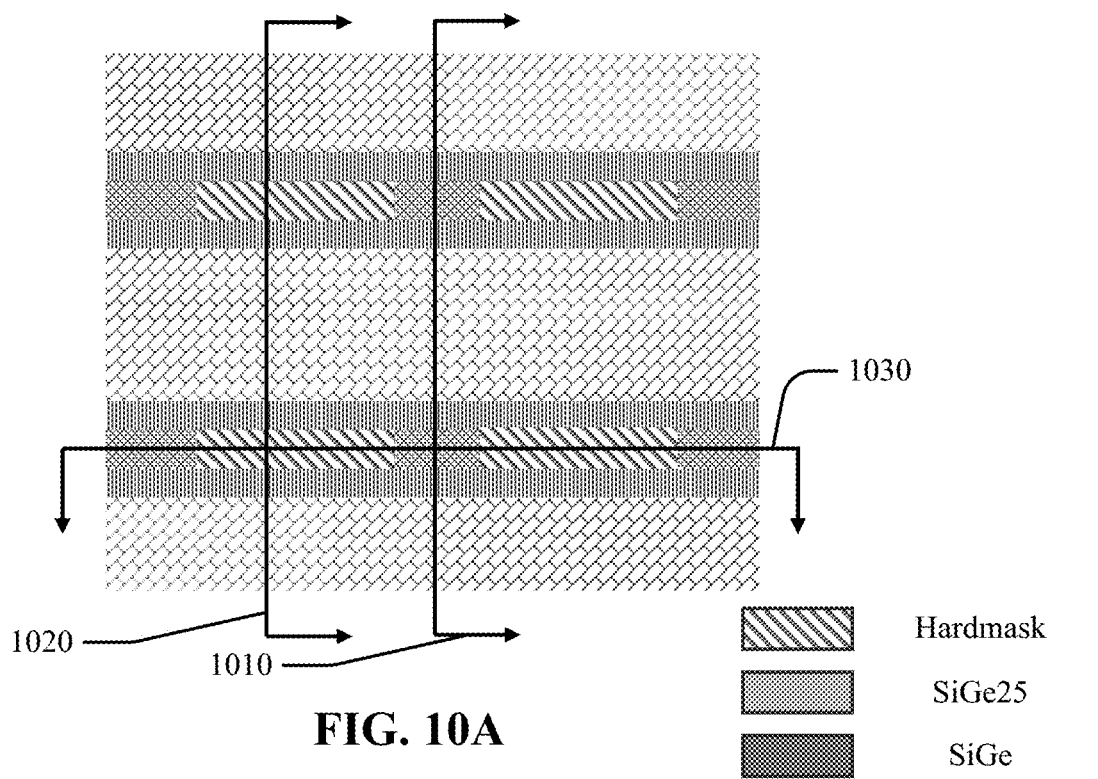
FIG. 10A illustrates a top-down view of a sixth stage of production of a transistor device in accordance with one or more embodiments described herein.

FIG. 10A illustrates a top-down view of a sixth stage of production of a transistor device in accordance with one or more embodiments described herein. As shown by FIG. 10A, fin cut mask 801 can be removed and a dielectric fill material can be deposited on the regions etched away during the previous stage of production. FIG. 10A also comprises line 1010, line 1020 and 1030 for illustration of cross-sections.

Figure 10B:
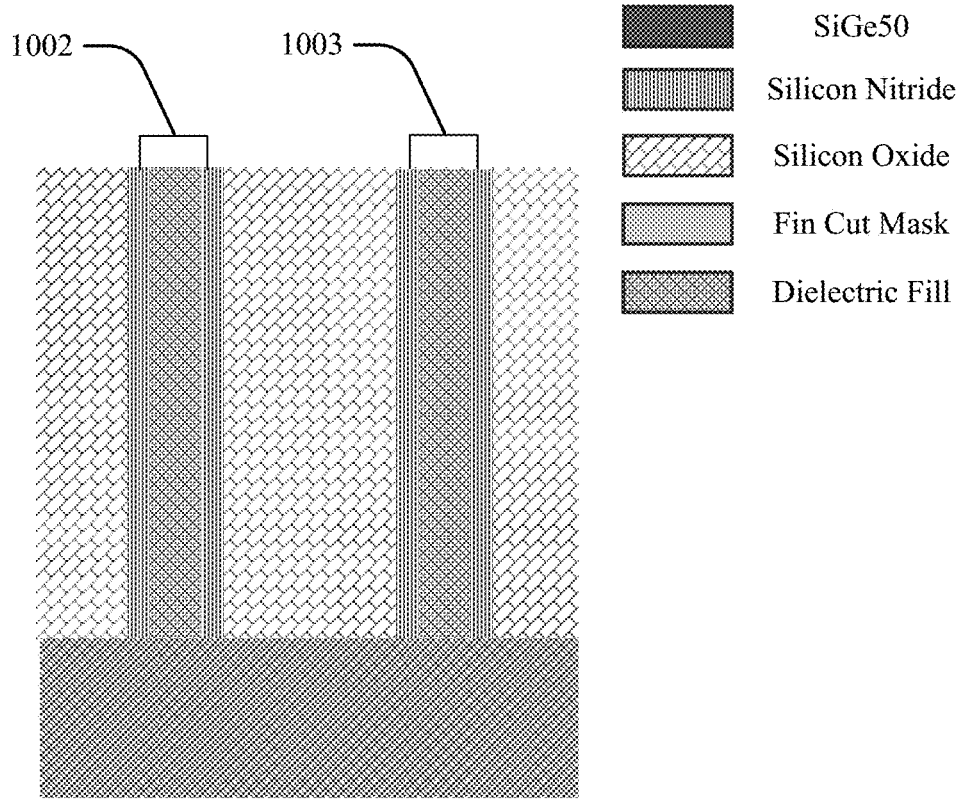
FIGS. 10B, 10C and 10D illustrate cross-sections of a sixth stage of production of a transistor in accordance with one or more embodiments described herein.
Figure 10C:
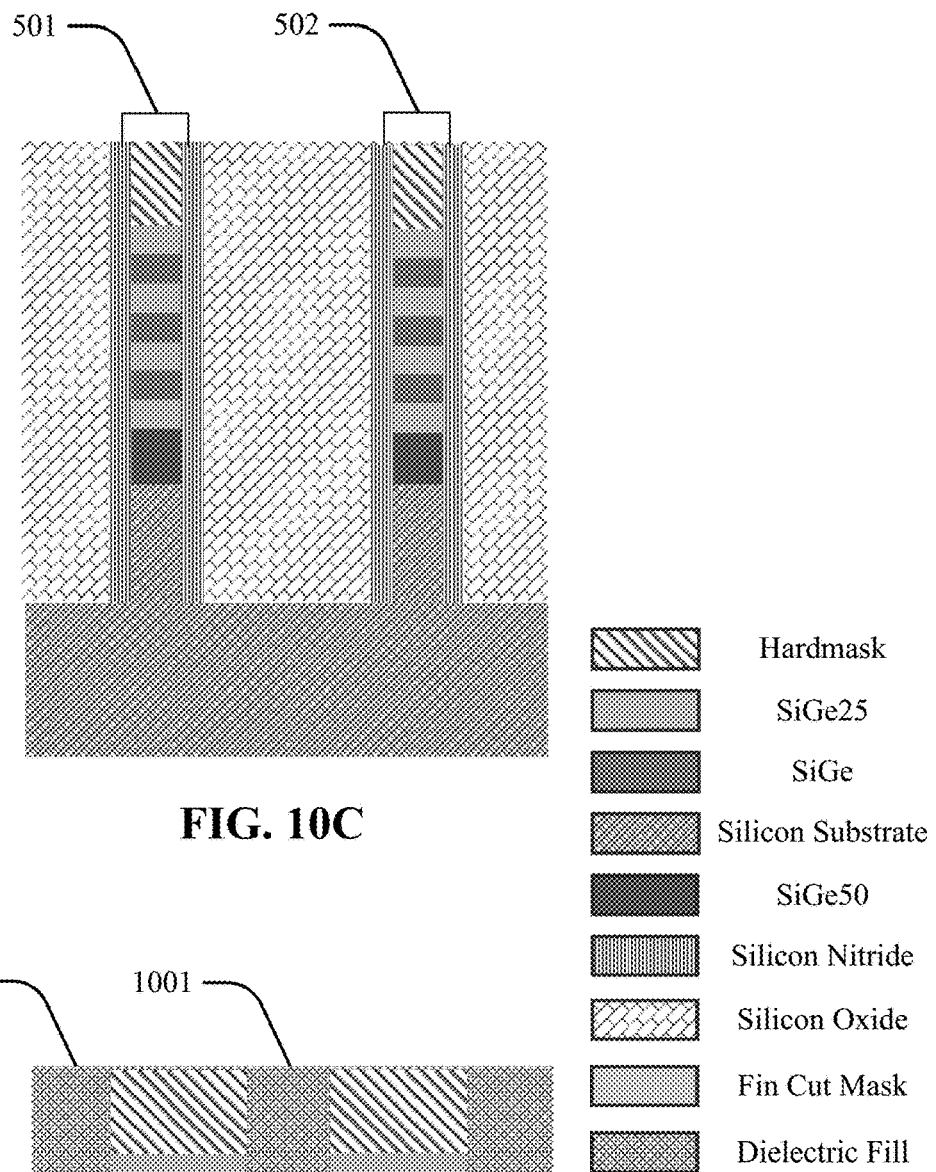
Figure 10D:
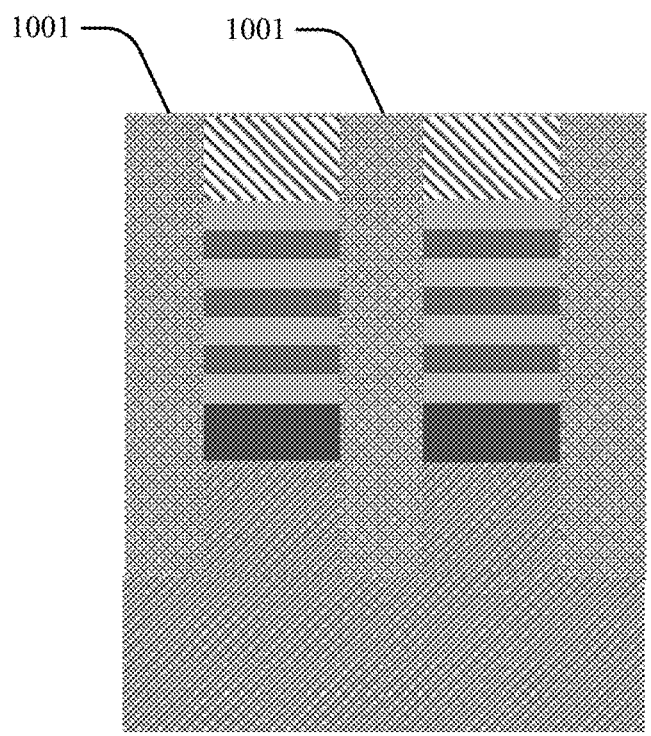

FIGS. 10B, 10C and 10D illustrate cross-sections of a sixth stage of production of a transistor in accordance with one or more embodiments described herein. FIG. 10B illustrates a cross-section along line 1010. As shown, the first channel 911 and the second channel 912 have been filled with a dielectric fill material to form support pillars 1002 and 1003. In an embodiment, the dielectric fill material can comprise at least one of SiCN, SION, SiCO, SiBCN, or another dielectric material.

FIG. 10C illustrates a cross-section along line 1020. As shown, portion of the first fin 501 and the second fin 502 covered by fin cut mask 801 are not covered by dielectric fill material. FIG. 10D illustrates a cross-section along line 1030. As shown, the portions of the first fin 501 etched away previously have been filled with dielectric material 1001 to form one or more support pillars. The one or more support pillars can provide mechanical stability and protect the unetched regions during further stages of production. As shown the support pillars can be taller than the unetched region, further protecting the unetched region during production.

Figure 11A:
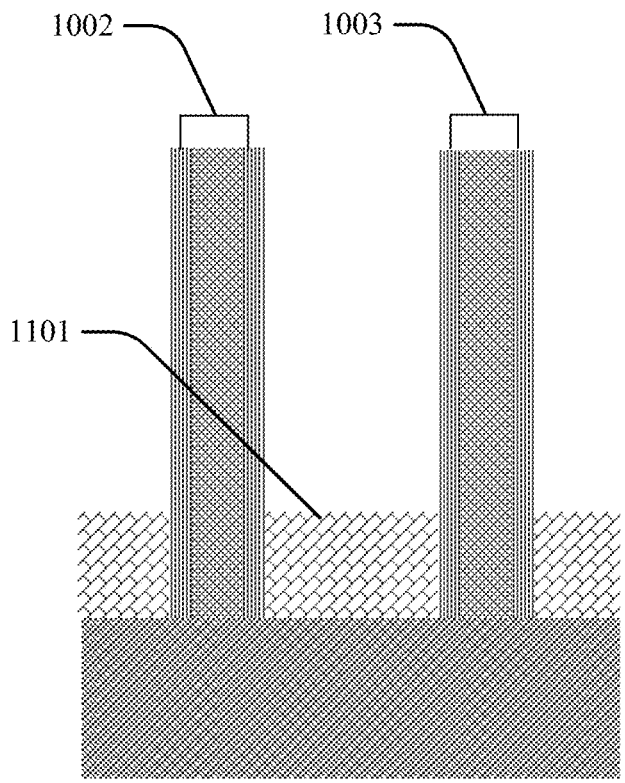
FIGS. 11A and 11B illustrates cross-sections of a seventh stage of production of a transistor in accordance with one or more embodiments described herein.
Figure 11B:
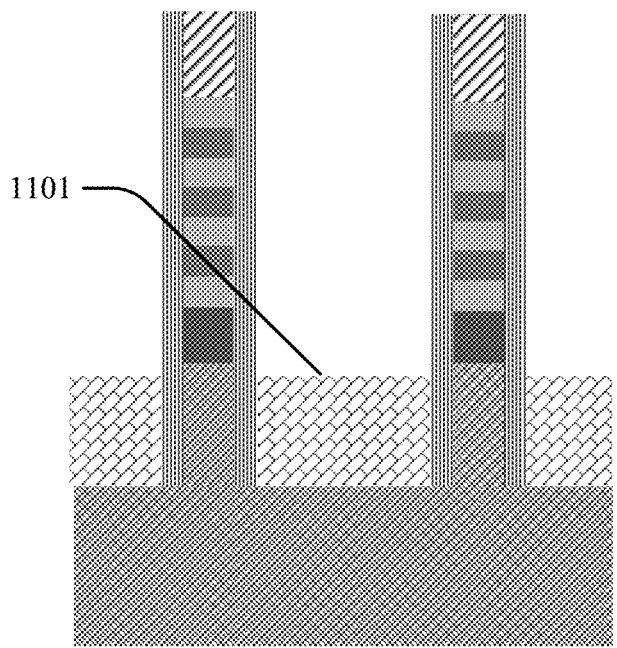

FIGS. 11A and 11B illustrates cross-sections of a seventh stage of production of a transistor in accordance with one or more embodiments described herein. FIG. 11A illustrates a cross-section along line 1010. As shown by FIG. 11A, silicon oxide material 701 can be recessed to form an STI region 1101 between the support pillar 1002 and the second support pillar 1003. FIG. 11B illustrates a cross-section along line 1020. As shown by FIG. 11B, the silicon oxide material 701 has been recessed to form STI region 1101.

Figure 12A:
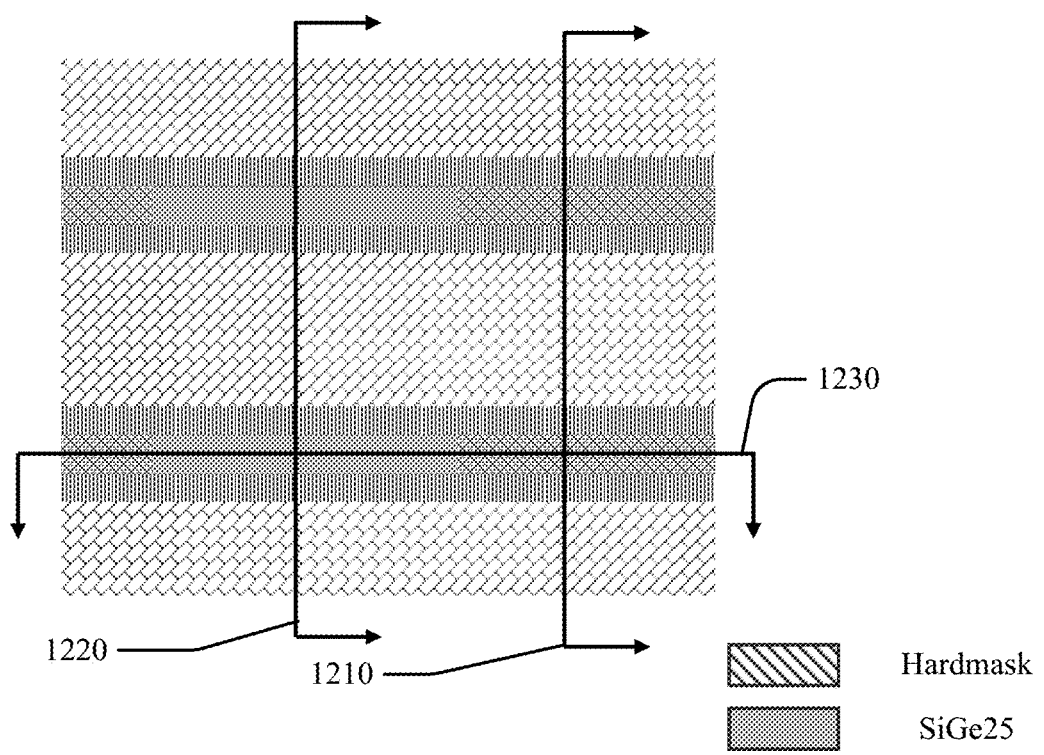
FIG. 12A illustrates a top-down view of an eighth stage of production of a transistor in accordance with one or more embodiments described herein.

FIG. 12A illustrates a top-down view of an eighth stage of production of a transistor in accordance with one or more embodiments described herein. As shown, the hardmask 418 and the exposed portion of nitride spacer 601 can be removed. At this stage, the device is ready to begin a polysilicon gate patterning process. FIG. 12A additionally comprises line 1210, line 1220 and line 1230 for illustration of cross-sections.

Figure 12B:
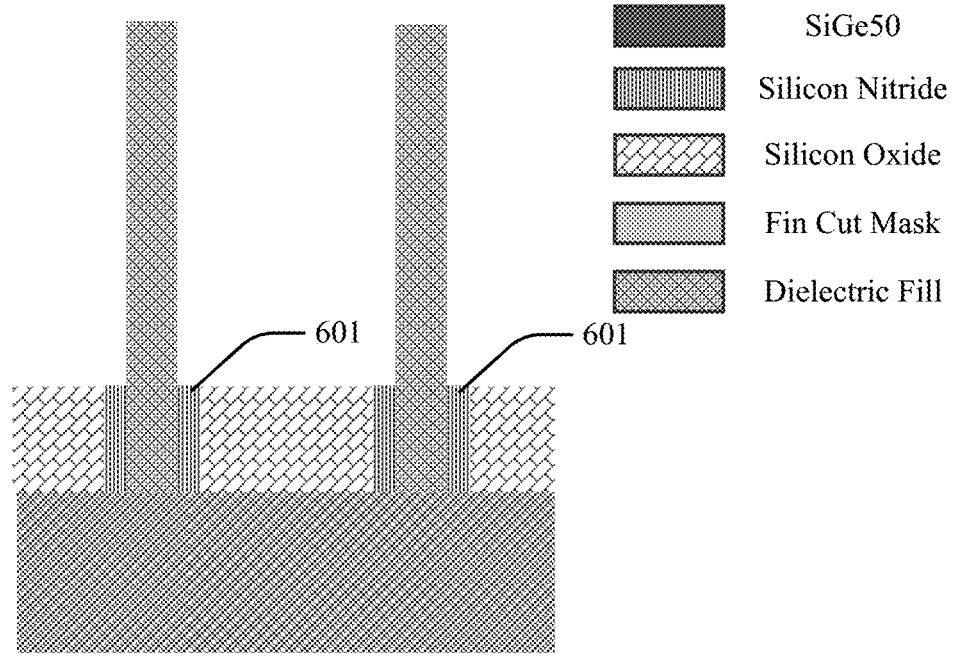
FIGS. 12B, 12C and 12D illustrate cross-section views of an eighth stage of production of a transistor device in accordance with one or more embodiments described herein.
Figures 12C, 12D:
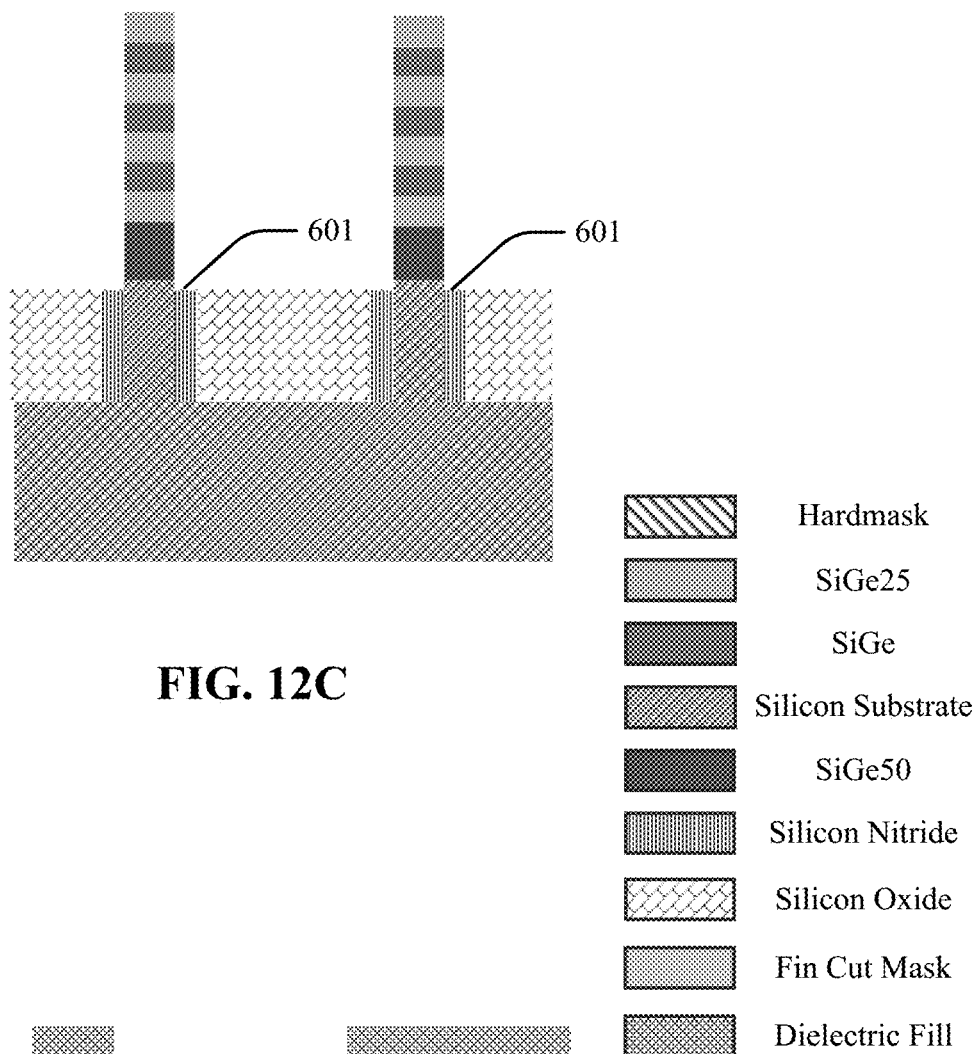

FIGS. 12B, 12C and 12D illustrate cross-section views of an eighth stage of production of a transistor device in accordance with one or more embodiments described herein. FIG. 12B illustrates a cross-section along line 1210. As shown by FIG. 12B, exposed portions of nitride spacer 601 have been recessed. FIG. 12C illustrates a cross-section along line 1220. As shown by FIG. 12C, the exposed portions of nitride spacer 601 have been recessed and hardmask 418 has been removed. FIG. 12D illustrates a cross-section along line 1230. As shown by FIG. 12D, hardmask 418 has been removed.

Figure 13A:
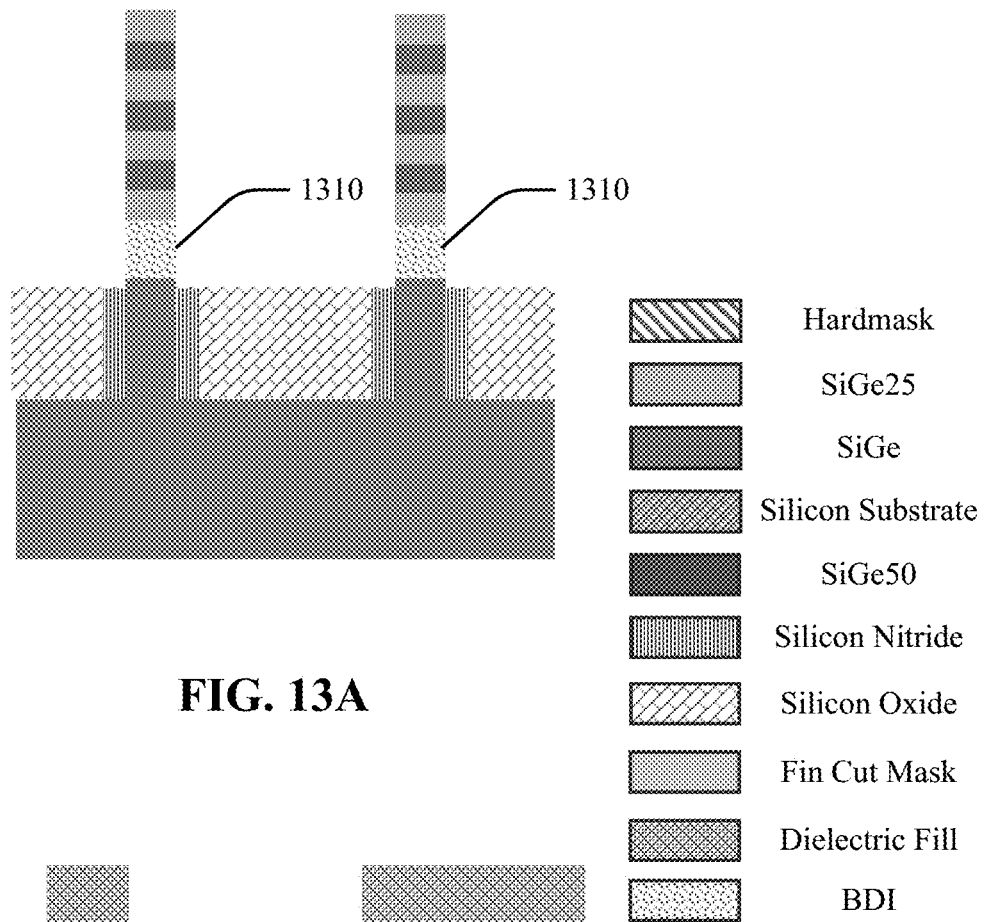
FIGS. 13A and 13B illustrate cross-sections of a ninth stage of production of a transistor device in accordance with one or more embodiments described herein.
Figure 13B:
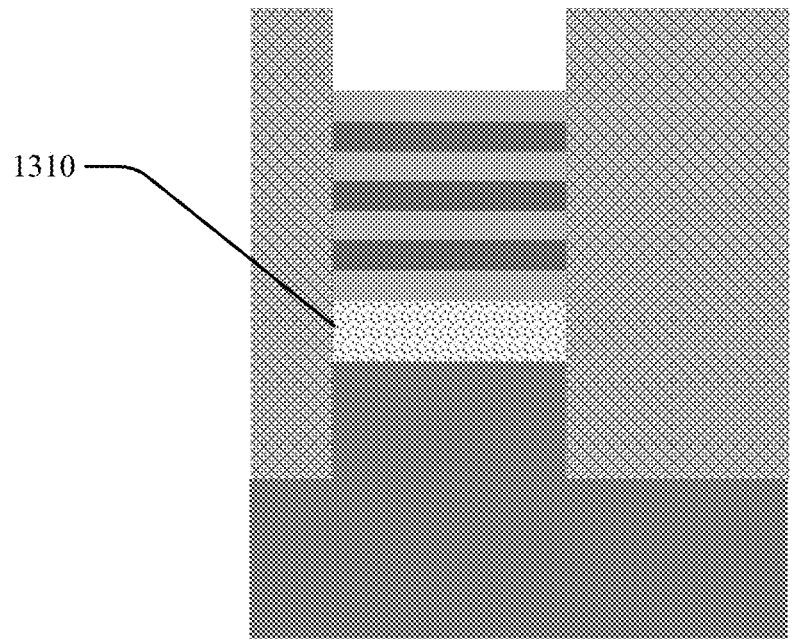

FIGS. 13A and 13B illustrate cross-sections of a ninth stage of production of a transistor device in accordance with one or more embodiments described herein. FIG. 13A illustrates a cross-section along line 1220. As shown by FIG. 13A, the first layer 420 comprising SiGe50 can be removed and a bottom dielectric isolation (BDI) 1310 can be formed through dielectric deposition and isotropic etch back. In an embodiment, BDI 1310 can comprise materials such as $Al_2O_3$, AlN or another suitable material. FIG. 13B illustrates a cross-section along line 1230. As shown by FIG. 13B, the first layer 420 comprising SiGe50 has been removed and the BDI 1310 has been formed.

Figure 14A:
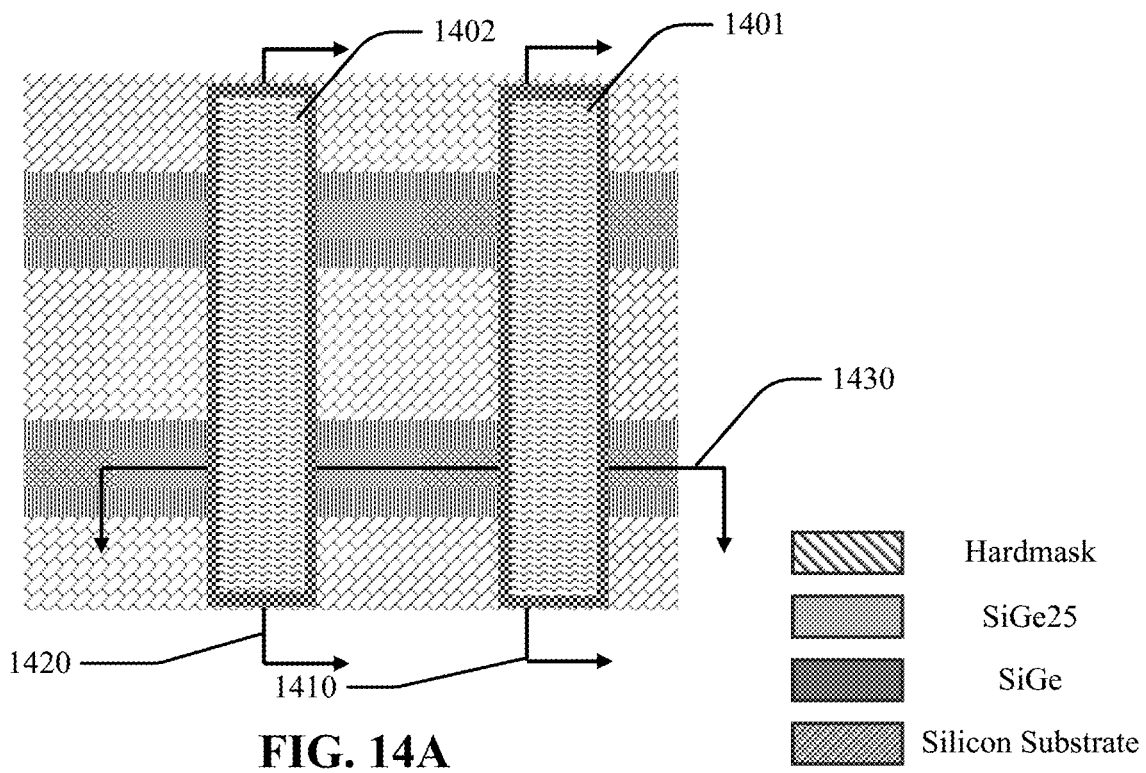
FIG. 14A illustrates a top-down view of a tenth stage of production of a transistor device in accordance with one or more embodiments described herein.

FIG. 14A illustrates a top-down view of a tenth stage of production of a transistor device in accordance with one or more embodiments described herein. As shown, polysilicon can be deposited to form dummy gates 1401 and 1402, and a side wall spacer can be deposited on the side walls of dummy gates 1401 and 1402. FIG. 14A also comprises lines 1410, 1420 and 1430 for illustration of cross-sections.

Figure 14B:
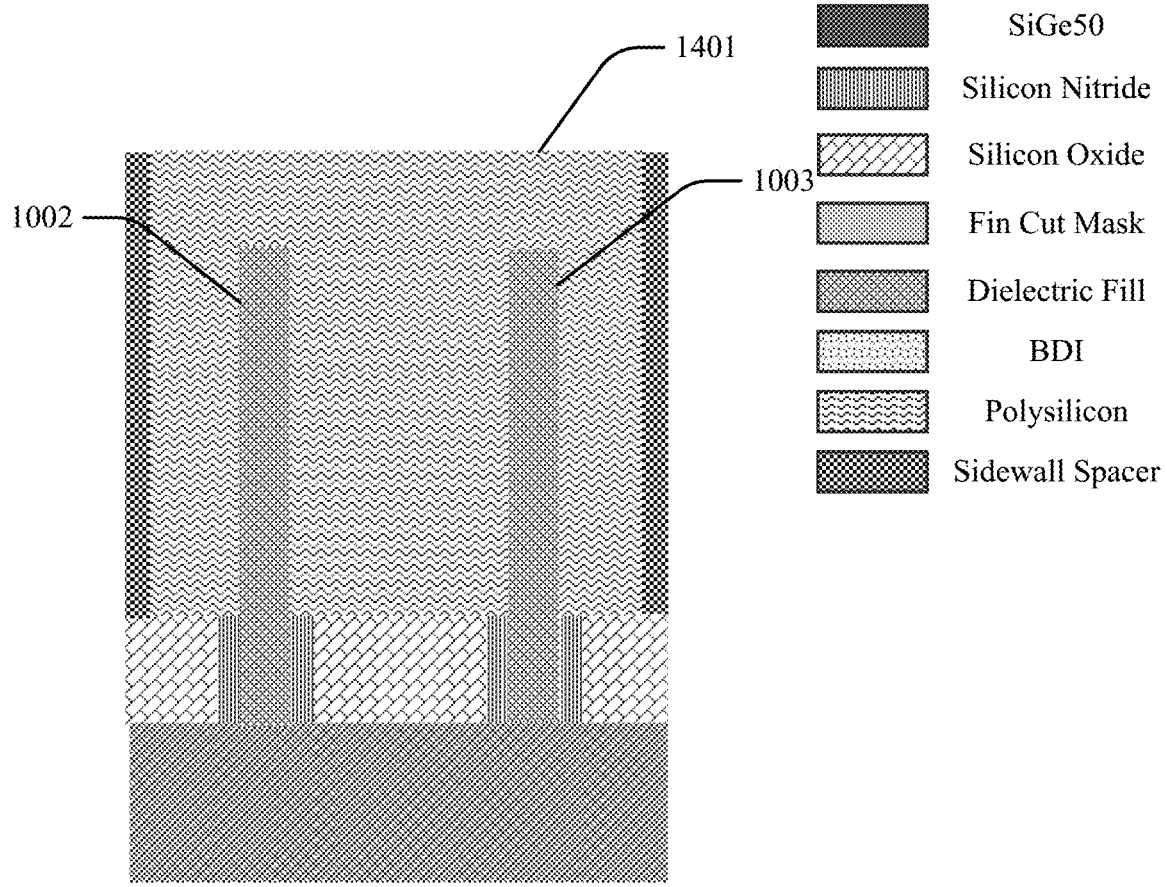
FIGS. 14B, 14C and 14D illustrate cross-sections of a tenth stage of production of a transistor device in accordance with one or more embodiments described herein.
Figure 14C:
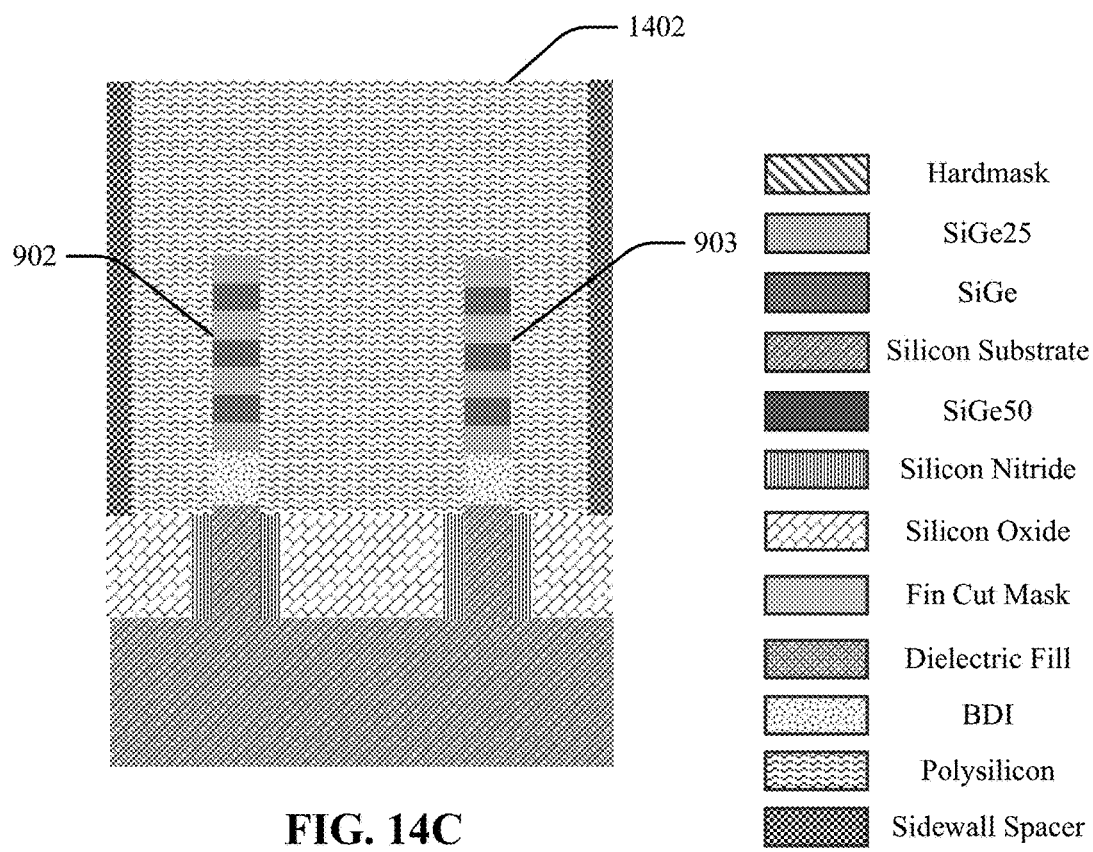
Figure 14D:
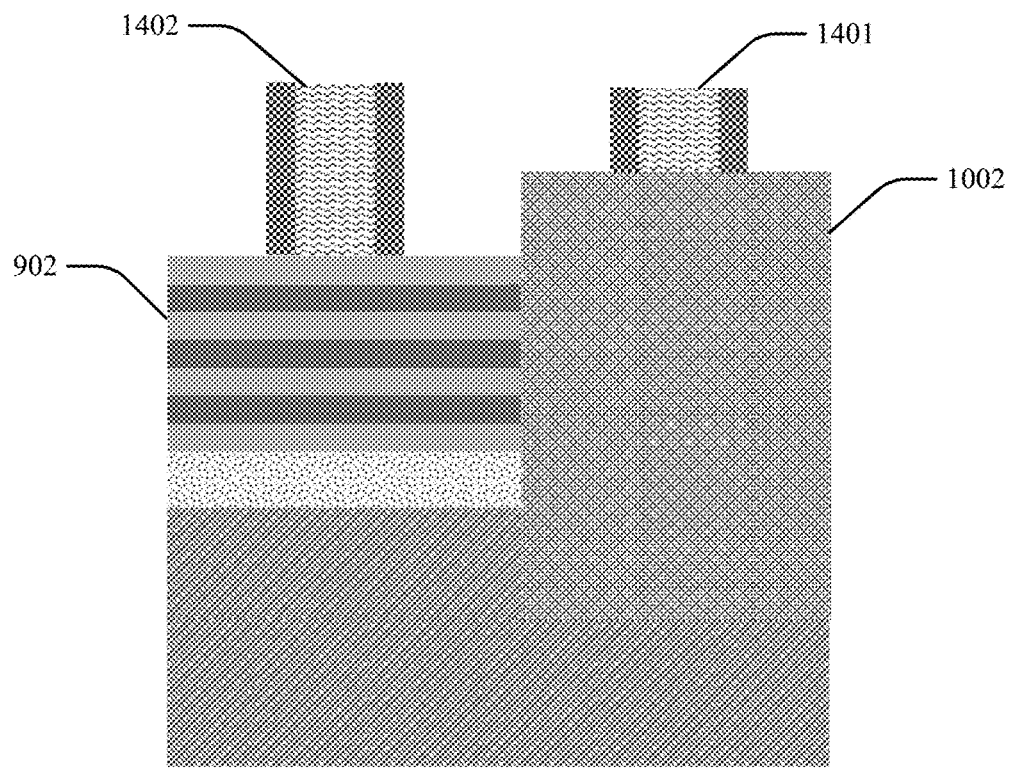

FIGS. 14B, 14C and 14D illustrate cross-sections of a tenth stage of production of a transistor device in accordance with one or more embodiments described herein. FIG. 14B illustrates a cross-section along line 1410. As shown by FIG. 14B, dummy gate 1401 wraps around support pillars 1002 and 1003, providing mechanical stability to dummy gate 1401. This mechanical stability can help prevent structural issues, such as gate-flop, during production. FIG. 14C illustrates a cross-section along line 1420. As shown, by FIG. 14C, dummy gate 1402 wraps around first active pillar 902 and second active pillar 903. FIG. 14D illustrates a cross-section along line 1430. As shown by FIG. 14D, dummy gates 1401 and 1402 wrap around the tops of support pillar 1002 and the first active pillar 902, thereby providing mechanical stability for the dummy gates 1401 and 1402. Furthermore, as shown, support pillar 1002 prevents the first active pillar from bending horizontally, thus providing improved mechanical stability.

Figure 15A:
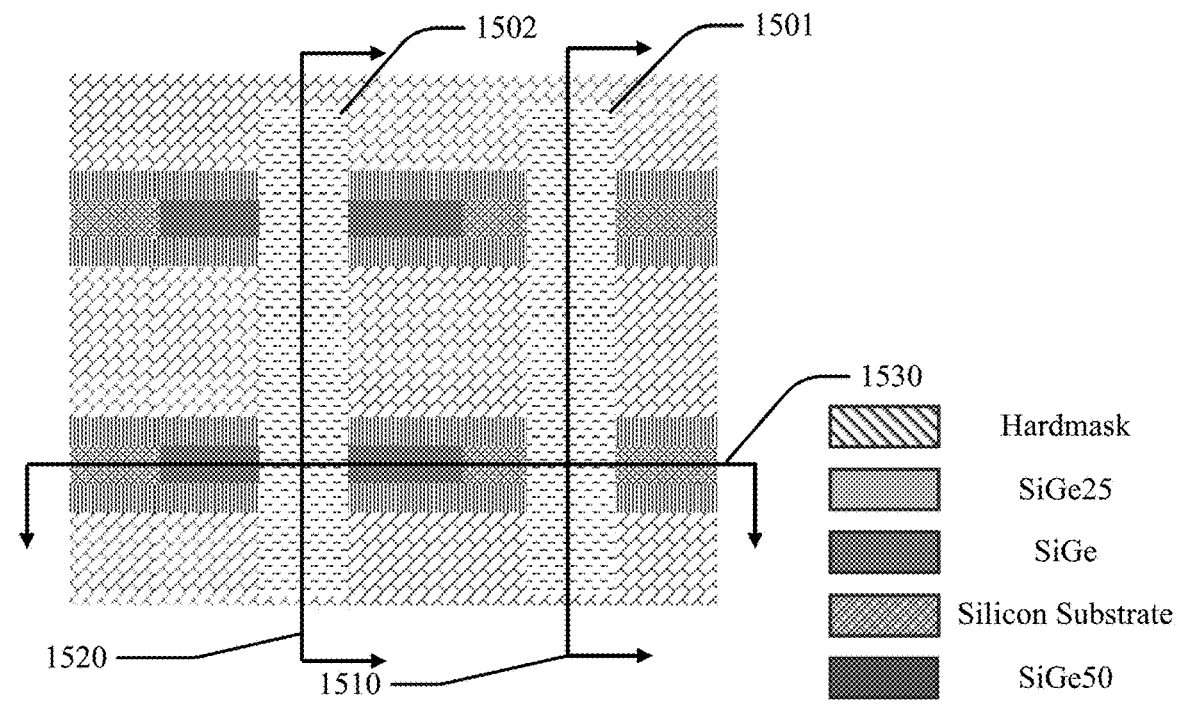
FIG. 15A illustrates a top-down view of an eleventh stage of production of a transistor device in accordance with one or more embodiments described herein.

FIG. 15A illustrates a top-down view of an eleventh stage of production of a transistor device in accordance with one or more embodiments described herein. As shown by FIG. 15A, dummy gates 1401 and 1402 can be removed and replaced by metallic gates 1501 and 1502 to form an operational transistor. FIG. 15A also comprises lines 1510, 1520 and 1530 for illustration of cross-sections.

Figure 15B:
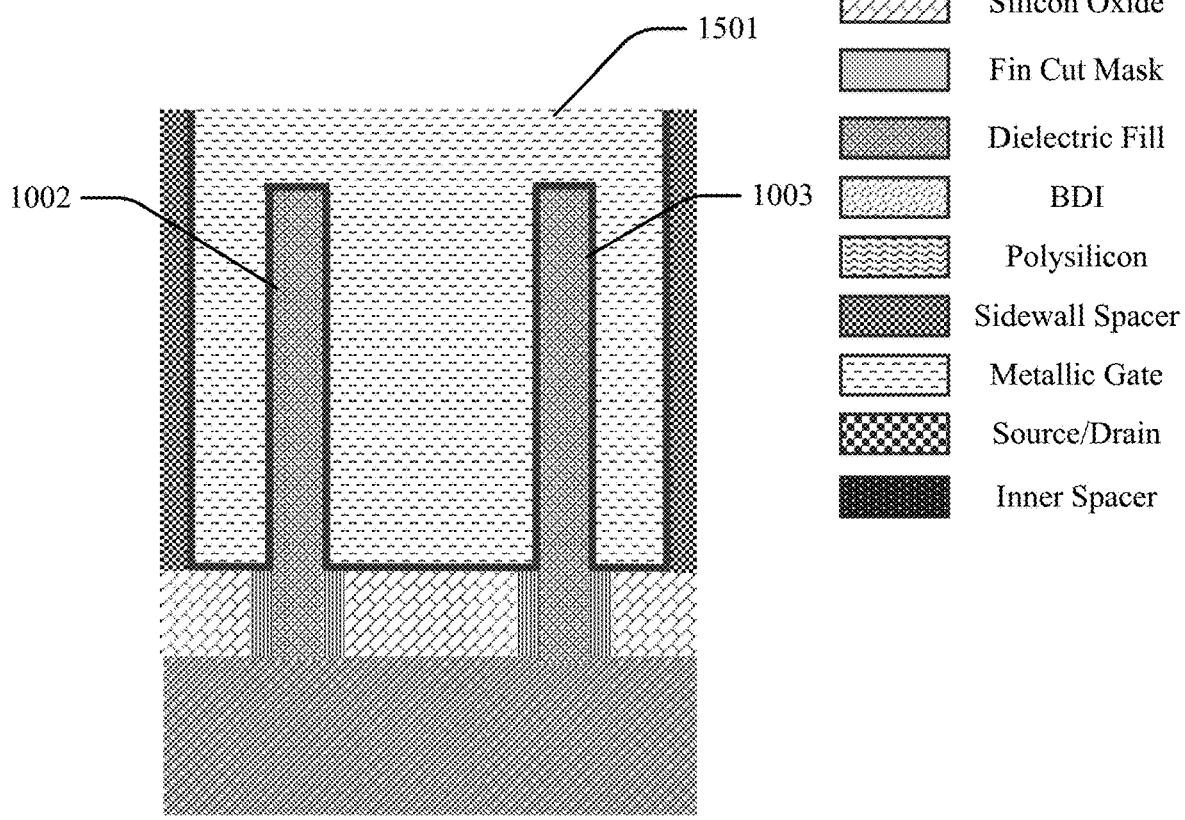
FIGS. 15B, 15C and 15D illustrate cross-sections of an eleventh stage of production of a transistor device in accordance with one or more embodiments described herein.
Figure 15C:
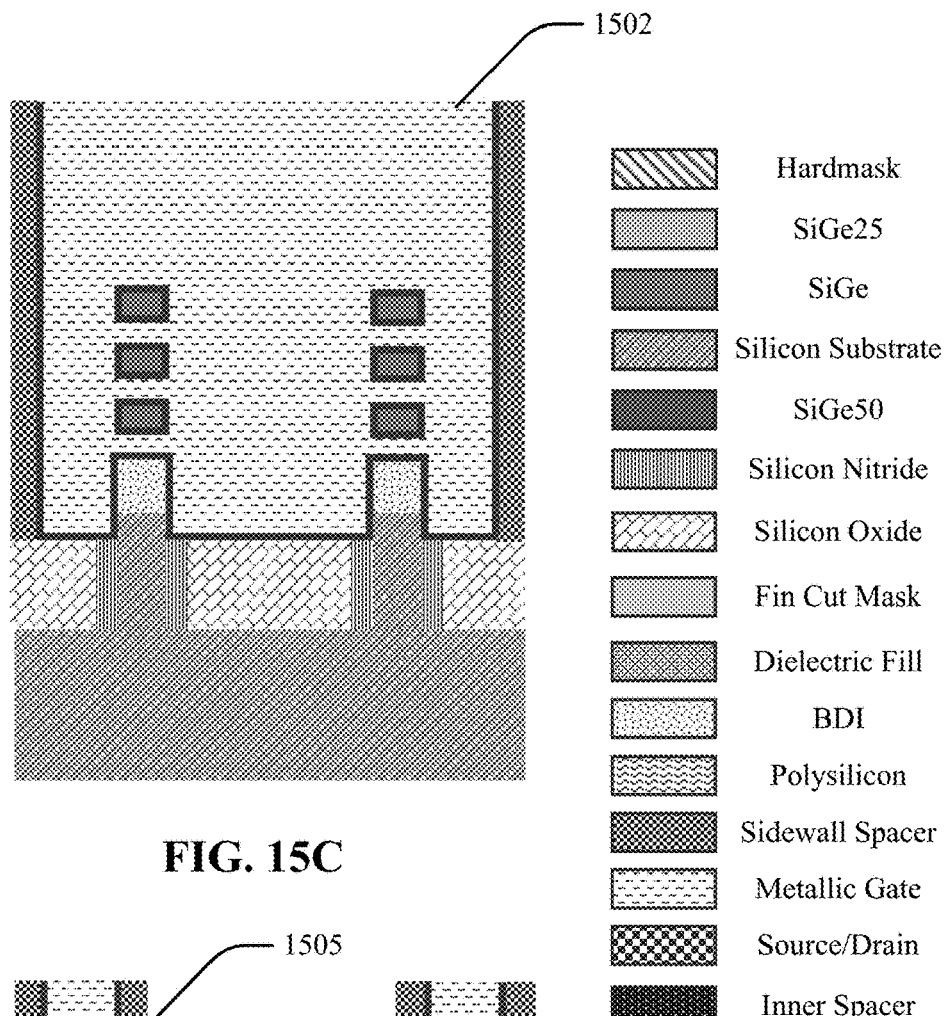
Figure 15D:
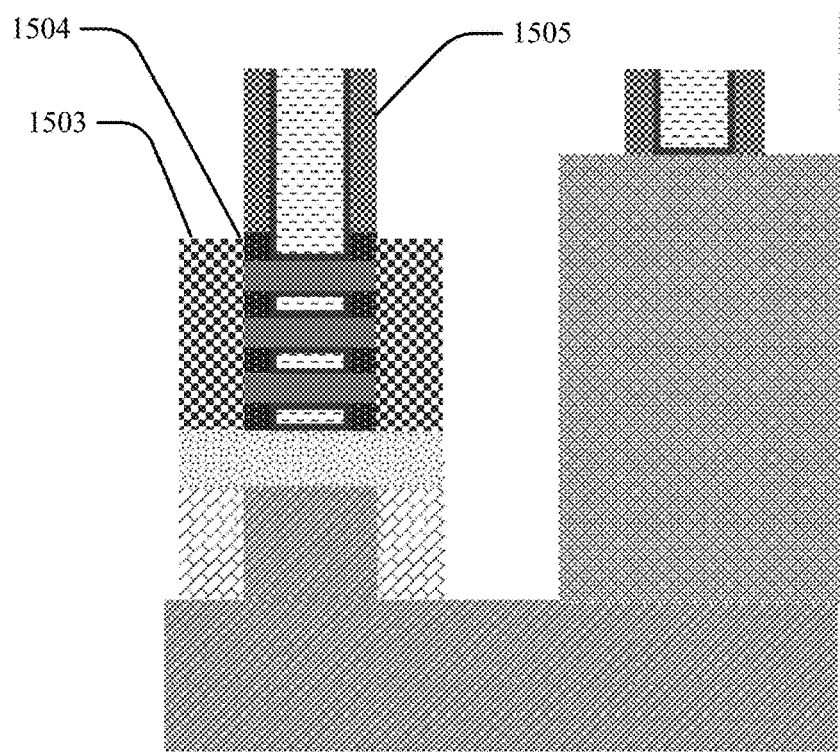

FIGS. 15B, 15C and 15D illustrate cross-sections of an eleventh stage of production of a transistor device in accordance with one or more embodiments described herein. FIG. 15B illustrates a cross-section along line 1510. As shown by FIG. 15B, metallic gate 1501 can wrap around support pillars 1002 and 1003, thereby providing additional mechanical stability for metallic gate 1501. FIG. 15C illustrates a cross-section along line 1520. As shown by FIG. 15C, the one or more layers of SiGe25 414 of the first active pillar 902 and the second active pillar 903 can be removed and replaced by a portion of metallic gate 1502. FIG. 15D illustrates a cross-section along line 1530. As shown by FIG. 15D, a source/drain 1503 and an inner spacer 1504 can be deposited on active pillar 902. As BDI 1310 is formed though dielectric deposition and isotropic etch back, harder BDI materials can be utilized when compared to existing methods. For example, materials such as $Al_2O_3$ or AlN can be utilized. This use of relatively harder materials prevents loss of BDI 1310 during production of inner spacer 1504, allowing for better isolation of the source/drain 1503.

Figure 16:
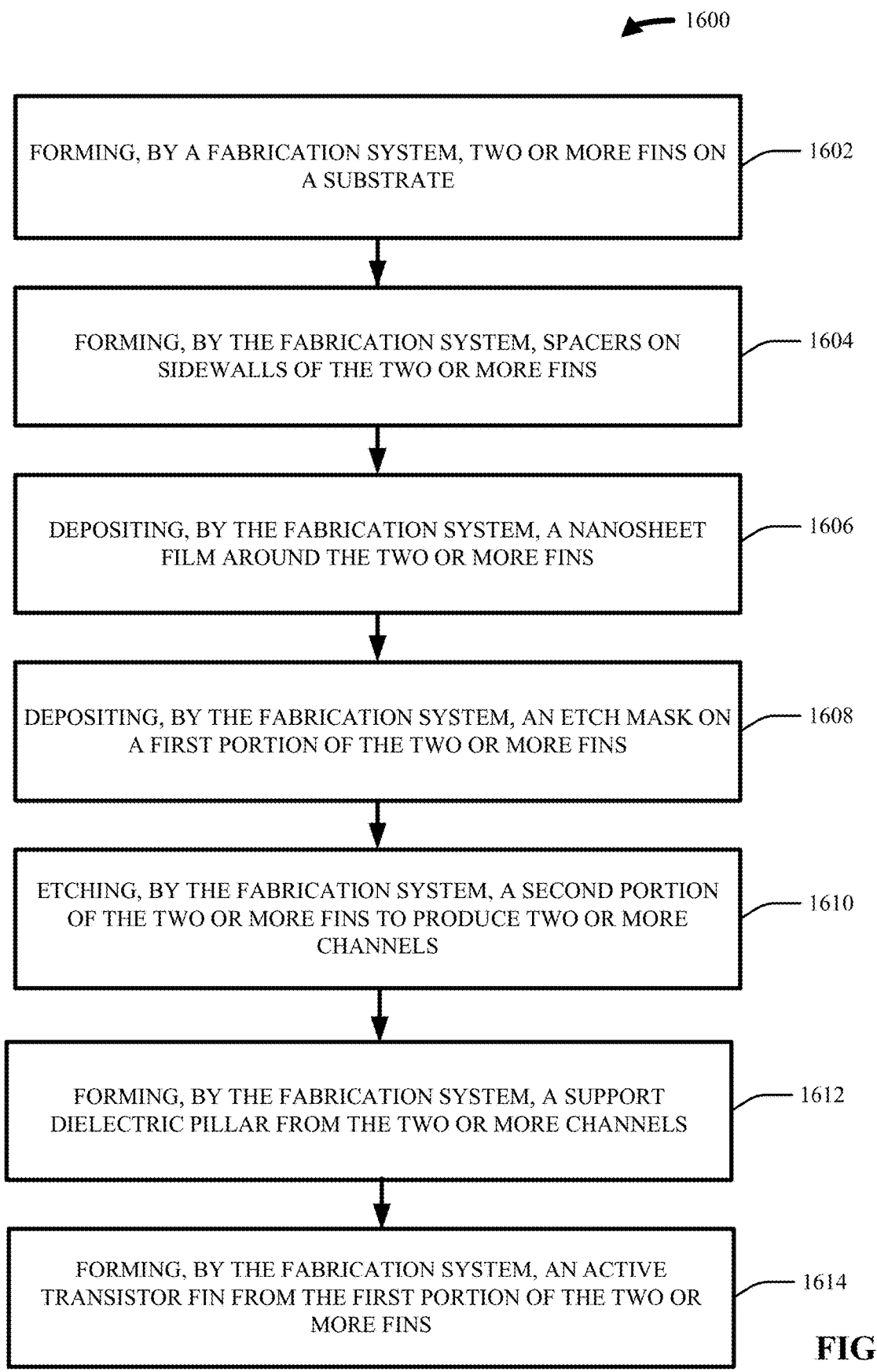
FIG. 16 illustrates an example, non-limiting flow diagram of a method of fabrication of a transistor with a support dielectric pillar in accordance with one or more embodiments described herein.

FIG. 16 illustrates an example, non-limiting flow diagram of a method of fabrication 1600 of a transistor with a support dielectric pillar in accordance with one or more embodiments described herein.

At 1602, method 1600 can comprise forming, by a fabrication system, two or more fins on a substrate. For example, a substrate can be cut to form two or more fins.

At 1604, method 1600 can comprise forming, by the fabrication system, spacers on sidewalls of the two or more fins. For example, a nitride spacer material can be deposited along the sidewalls of the two or more fins.

At 1606, method 1600 can comprise depositing, by the fabrication system, a nanosheet film around the two or more fins. For example, a silicon oxide material can be deposited around the two or more fins.

At 1608, method 1600 can comprise depositing, by the fabrication system, an etch mask on a first portion of the two or more fins. For example, an etch mask can be deposited on a portion of the fins that will become active fins to protect the portion from an etching process.

At 1610, method 1600 can comprise, etching, by the fabrication system, a second portion of the two or more fins to produce two or more channels. For example, as the second portion is not protected by the etch mask, the two or more fins can be etched away to produce two or more channels in the nanosheet film.

At 1612, method 1600 can comprise, forming, by the fabrication system, support dielectric pillars from the two or more channels. For example, a dielectric fill material can be deposited in the two or more channels to form two or more support dielectric pillars.

At 1614, method 1600 can comprise, forming, by the fabrication system, active transistor fins from the first portion of the two or more fins. For example, as the first portion of the two or more fins were not etched, a metallization process can be performed to produce a metallic gate around the first portion of the two or more fins to produce active transistor fins.

Figure 17:
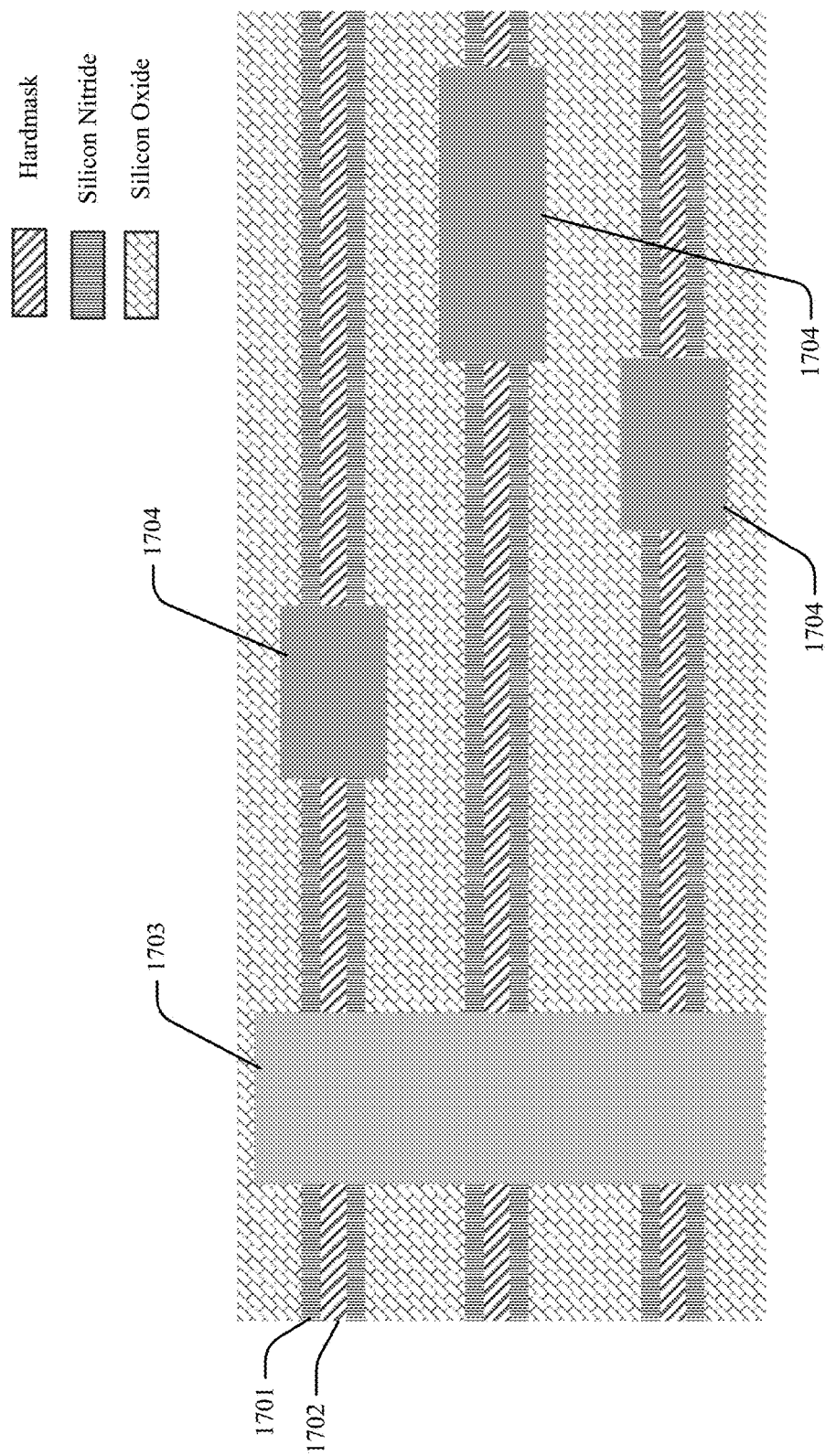
FIG. 17 illustrates a top-down view of an example, non-limiting, alternative substrate for production of a transistor in accordance with one or more embodiments described herein.

FIG. 17 illustrates a top-down view of an alternative substrate for production of a transistor in accordance with one or more embodiments described herein. In some embodiments, the substrate 1700 can be patterned using EUV lithography, wherein fin cut mask 1703 can be utilized to form dielectric support fins and active fins as described in greater detail above. In some embodiments, EUV patterning can be utilized to pattern substrate 1700. In some embodiments, RX cut masks 1704 can be utilized in addition to, or in place of fin cut mask 1703 to form dielectric support pillars and active fins as described in greater detail above.

An advantage of such methods, devices, and/or systems is that they provide greater mechanical stability to transistor devices both during production and in finished form. This increased mechanical stability can prevent production issues such as gate-flop which currently limit the height to width ratio of transistor gate structures, which in turn limits the performance of transistors. By improving mechanical stability of gate structures, taller gates can be utilized, thereby enabling design and production of transistors capable of improved performance. A practical application of the above-described devices is that they offer improved performance due to the enhanced mechanical stability enabling taller gate structures.

What is claimed is:

1. A transistor comprising:
   an active transistor fin, wherein the active transistor fin comprises a stack of layers, and wherein the stack of layers comprises:
   a first layer comprising a bottom dielectric isolation material, and
   a plurality of layers stacked on the first layer, wherein the plurality of layers comprises alternating layers of metallic gate layers and silicon germanium layers; and
   a support dielectric pillar located adjacent to the active transistor fin, wherein the support dielectric pillar stabilizes the active transistor fin.

2. The transistor of claim 1, wherein the support dielectric pillar is taller than the active transistor fin.

3. The transistor of claim 1, wherein the support dielectric pillar comprises silicon carbon oxide.

4. The transistor of claim 1, wherein the bottom dielectric isolation material comprises at least one of Al2O3 or AlN.

5. The transistor of claim 1, wherein the active transistor fin further comprises an inner spacer adjacent to each metallic gate layer of the plurality of layers, and wherein the inner spacer comprises a different material than the bottom dielectric isolation material.

6. The transistor of claim 1 further comprising a support gate, wherein the support gate surrounds the support dielectric pillar.

7. A method for fabricating a transistor, the method comprising:
cutting a first fin and a second fin on a substrate;
forming an active transistor fin from the first fin and the second fin, wherein the active transistor fin comprises a stack of layers, and wherein the stack of layers comprises:
a first layer comprising a bottom dielectric isolation material, and
a plurality of layers stacked on the first layer, wherein the plurality of layers comprises alternating layers of metallic gate layers and silicon germanium layers; and
forming a support dielectric pillar adjacent to the active transistor fin.

8. The method of claim 7, wherein the support dielectric pillar is taller than the active transistor fin.

9. The method of claim 7, wherein a material of the support dielectric pillar comprises silicon carbon oxide.

10. The method of claim 7, wherein the bottom dielectric isolation material comprises at least one of Al2O3 or AlN.

11. The method of claim 7, wherein the active transistor fin further comprises an inner spacer adjacent to each metallic gate layer of the plurality of layers, and wherein the inner spacer comprises a different material than the bottom dielectric isolation material.

12. The method of claim 7, further comprising forming a support gate, wherein the support gate surrounds the support dielectric pillar.

13. A method for fabricating a transistor, the method comprising:
forming two or more fins on a substrate;
forming spacers on sidewalls of the two or more fins;
depositing a nanosheet film around the two or more fins;
depositing an etch mask on a first portion of the two or more fins;
etching a second portion of the two or more fins to produce two or more channels;
forming a support dielectric pillar from the two or more channels, wherein the forming the support dielectric pillar comprises depositing a material into the two or more channels; and
forming an active transistor fin from the first portion of the two or more fins.

14. The method of claim 13, wherein the support dielectric pillar is taller than the active transistor fin.

15. The method of claim 13, wherein the nanosheet film comprises silicon oxide.

16. The method of claim 13, wherein the material comprises silicon carbon oxide.

17. The method of claim 13, wherein the forming the active transistor fin comprises forming a bottom dielectric isolation material and an inner spacer, wherein the inner spacer comprises a different material than the bottom dielectric isolation material.

18. The method of claim 17, wherein the bottom dielectric isolation material comprises at least one of Al2O3 or AlN.

19. The method of claim 13, further comprising depositing a metallic gate surrounding the active transistor fin.

20. The method of claim 13, wherein the active transistor fin comprises a stack of layers, and wherein the stack of layers comprises:
a first layer comprising a bottom dielectric isolation material, and
a plurality of layers stacked on the first layer, wherein the plurality of layers comprises alternating layers of metallic gate layers and silicon germanium layers.

* * * * *